United States Patent
Sugiyama et al.

[19]
[11] Patent Number: 6,131,533
[45] Date of Patent: Oct. 17, 2000

[54] JIG FOR FORMING HARD CARBON FILM OVER INNER SURFACE OF GUIDE BUSH USING THE JIG

[75] Inventors: Osamu Sugiyama; Yukio Miya; Ryota Koike; Takashi Toida, all of Tokorozawa; Toshiichi Sekine, Tanashi, all of Japan

[73] Assignee: Citizen Watch Co., Ltd., Tokyo, Japan

[21] Appl. No.: 08/910,828

[22] Filed: Aug. 15, 1997

[30] Foreign Application Priority Data

Aug. 15, 1996 [JP] Japan ................................ 8-215556
Aug. 15, 1996 [JP] Japan ................................ 8-215559
Aug. 19, 1996 [JP] Japan ................................ 8-217352

[51] Int. Cl.[7] ............................ C23C 16/00; C23C 16/26
[52] U.S. Cl. .............................. 118/723 E; 219/121.49; 219/121.52; 219/121.48; 219/12.47; 373/10; 427/451; 427/452; 279/35; 279/106; 279/137; 279/906; 82/126; 82/127
[58] Field of Search .......................... 29/27 C; 89/14.4; 181/223; 82/225, 126; 414/14, 18; 52/726.1; 118/723 E

[56] References Cited

U.S. PATENT DOCUMENTS

| | | | |
|---|---|---|---|
| 4,404,878 | 9/1983 | Blanchard et al. | 82/127 |
| 4,410,191 | 10/1983 | James | 279/35 |
| 4,574,666 | 3/1986 | Habegger | 82/127 |
| 4,970,364 | 11/1990 | Muller | 427/451 |
| 5,115,702 | 5/1992 | Link | 82/126 |
| 5,232,569 | 8/1993 | Nelson et al. | 204/192.15 |
| 5,278,861 | 1/1994 | Damond et al. | 373/10 |
| 5,363,400 | 11/1994 | Damond et al. | 373/10 |
| 5,436,426 | 7/1995 | Nerz | 219/121.49 |
| 5,464,962 | 11/1995 | Luo et al. | 219/121.52 |

*Primary Examiner*—Thi Dang
*Assistant Examiner*—Rudy Zervigon
*Attorney, Agent, or Firm*—Armstrong, Westerman, Hattori, McLeland & Naughton

[57] ABSTRACT

A hard carbon film is formed over an inner surface of a guide bush by fixing an auxiliary electrode support member for supporting an auxiliary electrode of a jig for forming a film in a center bore of the guide bush by an auxiliary electrode insulation member, disposing an auxiliary electrode in alignment with the axis of the center bore so as to face the inner surface, disposing legs, and a first electrode plate, a second electrode plate, and the insulation member which are fixed to the legs are placed on the bottom of a vacuum vessel placing the guide bush on the first electrode plate contacted electrically with a power source, while the projection of the auxiliary electrode support member projecting out of the auxiliary electrode insulation member is contacted electrically with the second electrode plate. The auxiliary electrode is grounded through the auxiliary electrode support member, the second electrode plate, the legs, and the vacuum vessel, a gas containing carbon is introduced into the vacuum vessel after evacuating the vacuum vessel, and a plasma is produced in the vacuum vessel by supplying electric power to the guide bush through the first electrode plate from the power source.

12 Claims, 14 Drawing Sheets

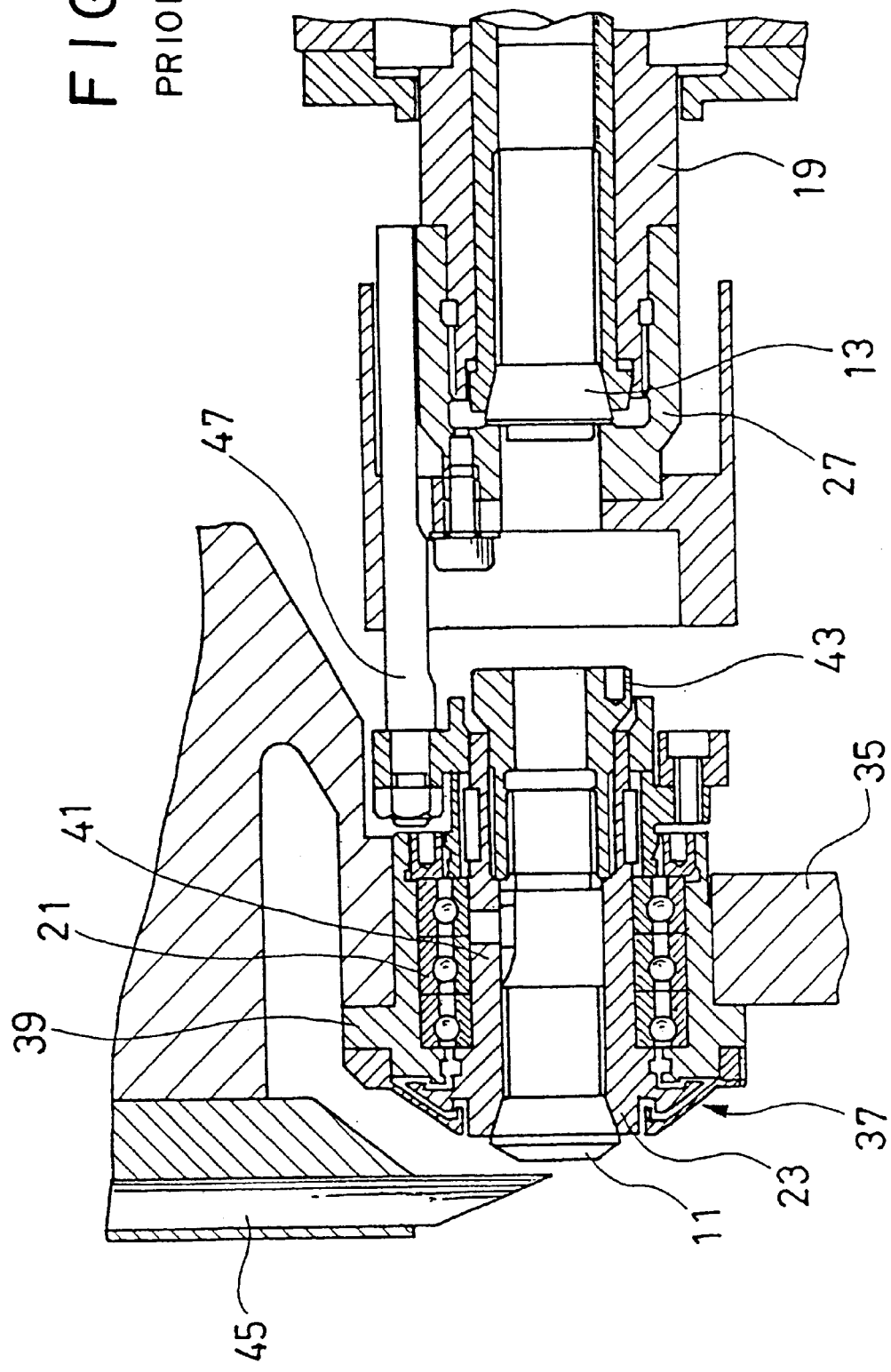

JIG FOR FORMING HARD CARBON FILM OVER INNER SURFACE OF GUIDE BUSH USING THE JIG

BACKGROUND OF THE INVENTION

1. Field of the Invention

The present invention relates to a jig for forming a film over the inner surface of a bore of a guide bush mounted on an automatic lathe to support a rodlike workpiece for rotation and axial sliding at a position near a cutting tool (cutter), and a method of forming a hard carbon film over the inner surface of the guide bush to be in sliding contact with the workpiece.

2. Description of the Related Art

Guide bushes mounted on the column of an automatic lathe to hold a rodlike workpiece for rotation at a position near a cutting tool are classified into rotary guide bushes and stationary guide bushes. A rotary guide bush rotates together with a workpiece and holds the workpiece for axial sliding. A stationary guide bush remains stationary and holds a workpiece for rotation and axial sliding.

A guide bush of either type has a portion having a taper outer surface provided with slits to make the same portion elastic, a threaded portion to hold the guide bush on the column, and an inner surface for holding a workpiece. The inner surface always in sliding contact with a workpiece is liable to be worn and, particularly, the inner surface of a stationary guide bush is worn rapidly.

Therefore, a guide bush proposed in JP-A No. 4-141303 has an inner surface to be in sliding contact with a workpiece which slides and rotates on the inner surface, provided with a superhard alloy or a ceramic material attached to the inner surface by brazing or the like.

When the inner surface of a guide bush is attached with a superhard alloy or a ceramic material excellent in wear resistance and heat resistance the wear of the inner surface of the guide bush can be reduced to some extent.

However, when the workpiece is subjected to heavy machining on an automatic lathe, in which the depth of cut is large and the cutting speed is high, the workpiece is damaged or seizing occurs due to decrease in the diametrical clearance between the guide bush and the workpiece even if the inner surface of the guide bush is attached with a superhard alloy or a ceramic material, because the superhard alloy and the ceramic material have a comparatively large coefficient of friction and a low thermal conductivity. Therefore, it has been difficult to increase the depth of cut and cutting speed.

The stationary guide bush has advantages that a workpiece can be accurately machined in a high roundness because the workpiece can be held so that its axis may not run out, less noise is generated, and the automatic lathe may be of a simple, compact construction.

However, the inner surface of the stationary guide bush is worn far more rapidly than that of the rotary guide bush and hence it is more difficult to increase depth of cut and cutting speed when the stationary guide bush is employed.

In order to solve the problem, the inventors have proposed a guide bush which can drastically improve abrasion resistance of the inner surface of a guide bush to be in sliding contact with a workpiece without occurrence of damage to the workpiece and seizing, and increase a cutting amount and a machining speed by an automatic lathe.

The hard carbon film is formed of a hydrogenated amorphous carbon closely resembling diamond in properties. Therefore, hydrogenated amorphous carbon is also called diamondlike carbon (DLC).

The hard carbon film (DLC film) has a high hardness (not lower than Vickers 3000 Hv), is excellent in wear resistance corrosion resistance, and has a small coefficient of friction (about ⅛ of a superhard alloy).

There is a CVD method (Plasma Chemical Vapor Deposition Process) for forming a hard carbon film as a method of forming the aforementioned hard carbon film on the inner surface of the guide bush, in which, for example, a plasma is produced by evacuating the vessel to a vacuum of $5 \times 10^{-3}$ torr at which the film is formed in the atmosphere of a gas containing carbon by applying a DC voltage of −3 kV to the guide bush by a DC power source.

However, since the hard carbon film is formed by decomposing the gas containing carbon mainly by the plasma produced around a region surrounding the guide bush in the plasma CVD method, the hard carbon film is formed uniformly on the outer surface of the guide bush, but the hard carbon film formed on the inner surface of the guide bush is inferior in adhesion and besides inferior in film quality such as hardness.

This is because the plasma in the center bore generates an abnormal discharge called a hollow discharge since electrodes of the same potential face each other in the space of the center bore of the guide bush. The hard carbon film formed by this hollow discharge is a polymer-like film which is inferior in adhesion and rigidity, and is easily peeled off the inner surface of the guide bush.

In the aforementioned method of forming a hard carbon film, a guide bush 11 is applied with a DC voltage of −3 kV by a DC voltage power source 73 at a vacuum of $5 \times 10^{-3}$ torr at which the film is formed.

In such a state of a vacuum of $5 \times 10^{-3}$ torr in the vacuum vessel, electric charges are liable to be concentrated in the space of the vacuum vessel, resulting in low impedance in the space. Therefore, an abnormal discharge, i.e., an arc discharge is liable to be caused at the moment when the plasma discharge starts.

Further, adhesion of the film to the guide bush depends on the film quality formed at this initial stage of forming the film because the moment when the plasma discharge starts is also the initial stage of forming the hard carbon film.

Accordingly, there arises a problem that the quality and adhesion of the hard carbon film is lowered and the film peels off the guide bush when the abnormal discharge, i.e., the arc discharge, is generated at the initial stage of the plasma discharge.

The present invention is intended to solve such problems and to form a hard carbon film on the inner surface of a guide bush contacting a workpiece with excellency of quality and adhesion by the plasma CVD method.

SUMMARY OF THE INVENTION

In order to solve the above objects, the present invention provides a following jig for forming a film and a method of forming a hard carbon film over the inner surface of a guide bush.

The present invention provides a jig for forming a film by supporting a guide bush in a vacuum vessel and conducting electricity through the guide bush when a hard carbon film is formed over the inner surface of the guide bush to be mounted on an automatic lathe and to be in sliding contact with a workpiece by a plasma CVD process.

The jig for forming the film comprises a rodlike auxiliary electrode inserted into a center bore forming the inner surface of the guide bush, an auxiliary electrode support member made of a conductive material for supporting the auxiliary electrode along with the axis of the center bore so as to face the inner surface, an auxiliary electrode insulation member inserted into an stepped section which has an internal diameter larger than the diameter of the inner surface of the bore of the guide bush so as to fix the auxiliary electrode support member in the guide bush and to project the same in the opposite direction of the auxiliary electrode along the axis of the center bore thereof, a first electrode plate made of a conductive material on which the guide bush is mounted with its axis perpendicular while the end portion of the stepped section side is contacted therewith electrically, legs made of a conductive material to be put on the bottom of the vacuum vessel, a second electrode plate made of a conductive material which is integrated with the legs and is connected with the projection of the auxiliary electrode support member projected out of the auxiliary electrode insulation member, and an insulation member for insulating the first electrode plate from the second electrode plate and for fixing them to the legs.

The jig for forming a film may be further provided with a guide bush receptor which comprises a conductive material for a larger contact area for the both that is mounted on the end face of the stepped section of a guide bush or on the first electrode plate.

The jig for forming a film may be provided with an insertion member made of a cylindrical conductive material having an internal diameter equal to that of the inner surface of the center bore of the guide bush that is to be inserted between the inner surface of the stepped section of the center bore and the auxiliary electrode insulation member.

The jig for forming the film may be constituted so that the auxiliary electrode insulation member comprises two porcelain insulators divided in the axial direction of the center bore of the guide bush, the auxiliary electrode support member being supported by the two porcelain insulators, and the auxiliary electrode supported by the auxiliary electrode support member being projected out of one of the porcelain insulators while a portion of the auxiliary electrode support member is projected out of the other porcelain insulator.

Further, the jig for forming a film may be constituted so that the insulation member for insulating the first electrode plate from the second electrode plate and for fixing them to the legs comprises an insulation plate interposed between the first electrode plate and the second electrode plate and insulation members for covering the exposed portions of the first electrode plate and the second electrode plate respectively.

The jig for forming the film may be provided with a dummy member comprising a conductive material having a cylindrical shape with an internal diameter substantially equal to that of the inner surface of the center bore of the guide bush and mounted on the end face of the guide bush boring at the inner surface.

The jig for forming the film over a plurality of guide bushes may be constituted so that a plurality of auxiliary electrodes, auxiliary electrode support members and auxiliary electrode insulating members are provided for each of the guide bushes, and the first and second electrode plates, legs and insulating members are provided for a plurality of guide bushes in common.

The method of forming a hard carbon film over the inner surface of a guide bush is carried out in the following manner employing the jig for forming the film.

An auxiliary electrode support member for supporting the auxiliary electrode is fixed by the auxiliary electrode insulation member in the center bore of the guide bush in alignment with the axis of the center bore so as to face the inner surface.

On the other hand, the legs, the second electrode plate, and the first electrode plate with the insulation member therebetween which are fixed to the legs are placed on the bottom of a vacuum vessel.

The guide bush is placed on the first electrode plate with its expanded section downward and with the axis of the center bore perpendicular while the same is contacted electrically with the first electrode plate, and the first electrode plate is connected to a power source, while the projection of the auxiliary electrode support member projecting out of the auxiliary electrode insulation member is connected to the second electrode plate, and the auxiliary electrode is grounded through the auxiliary electrode support member, the second electrode plate, the legs, and the vacuum vessel.

Next, a gas containing carbon is introduced through the gas inlet port after evacuating the vacuum vessel, and a plasma is produced by supplying electric power to the guide bush through the first electrode plate by the power source so as to form a hard carbon film of hydrogenated amorphous carbon over the inner surface of the guide bush.

There is a method of forming a hard carbon film over the inner surface of a guide bush wherein a vacuum vessel provided with an anode and a filament therein is employed, and a plasma is produced by applying a DC voltage to the guide bush through the first electrode plate by the power source, a DC voltage to the anode, and an AC voltage to the filament, respectively.

Or, a plasma can be produced in the vacuum vessel by applying radio frequency power to the guide bush through the first electrode plate by the power source.

Further, a plasma can be produced in the vacuum vessel only by applying a DC voltage to the guide bush through the first electrode plate by the power source.

Thus, an excellent hard carbon film can be formed over the inner surface of a guide bush by producing a stable plasma in the center bore since the guide bush is supported reliably with its axis of the center bore perpendicular in the vacuum vessel while the auxiliary electrode is disposed in the bore in alignment with the axis thereof while being easily grounded, thereby supplying electric power to the guide bush easily and stably.

A guide bush receptor for a larger contact area for the guide bush and the first electrode plate is disposed between the guide bush and the first electrode plate, so that the plasma discharge can be stabler, thereby restricting dispersion of the thickness and quality of the hard carbon film.

When the insertion member of the jig for forming the film is inserted into the stepped section of the bore of the guide bush so as to neighbor the inner surface, the clearance around the auxiliary electrode can be uniform with no steps in the depth of the inner surface of the guide bush formed with the hard carbon film, and the plasma formed around the auxiliary electrode can be uniform so that the hard carbon film can be formed in a uniform thickness and quality thereof.

Also, by disposing the dummy member on the end face of the bore with its axis in alignment with the central axis thereof, the hard carbon film can be formed evenly on a region of inner surface of the bore.

Further, by covering the exposed portions of the first and the second electrode plates respectively, so as to lengthen the time for forming the film to thicken the film thickness, an abnormal discharge, i.e., an arc discharge, is unlikely to be caused at the portions where the electrodes are exposed.

The hard carbon film can be formed on inner surfaces of a plurality of guide bushes in a vacuum vessel by employing a plurality of the jigs for forming the film or the jig for forming the film on inner surfaces of a plurality of guide bushes.

The above and other objects, features and advantages of the invention will be apparent from the following detailed description which is to be read in conjunction with the accompanying drawings.

BRIEF DESCRIPTION OF THE DRAWINGS

FIG. 15 is a sectional view showing only the vicinity of a spindle of an automatic lathe provided with a rotary guide bush unit.

DETAILED DESCRIPTION OF THE PREFERRED EMBODIMENTS

Preferred embodiments of the present invention will be described hereinafter with reference to the drawings.

Description of Automatic Lathe Employing Guide Bush

Figure 14:
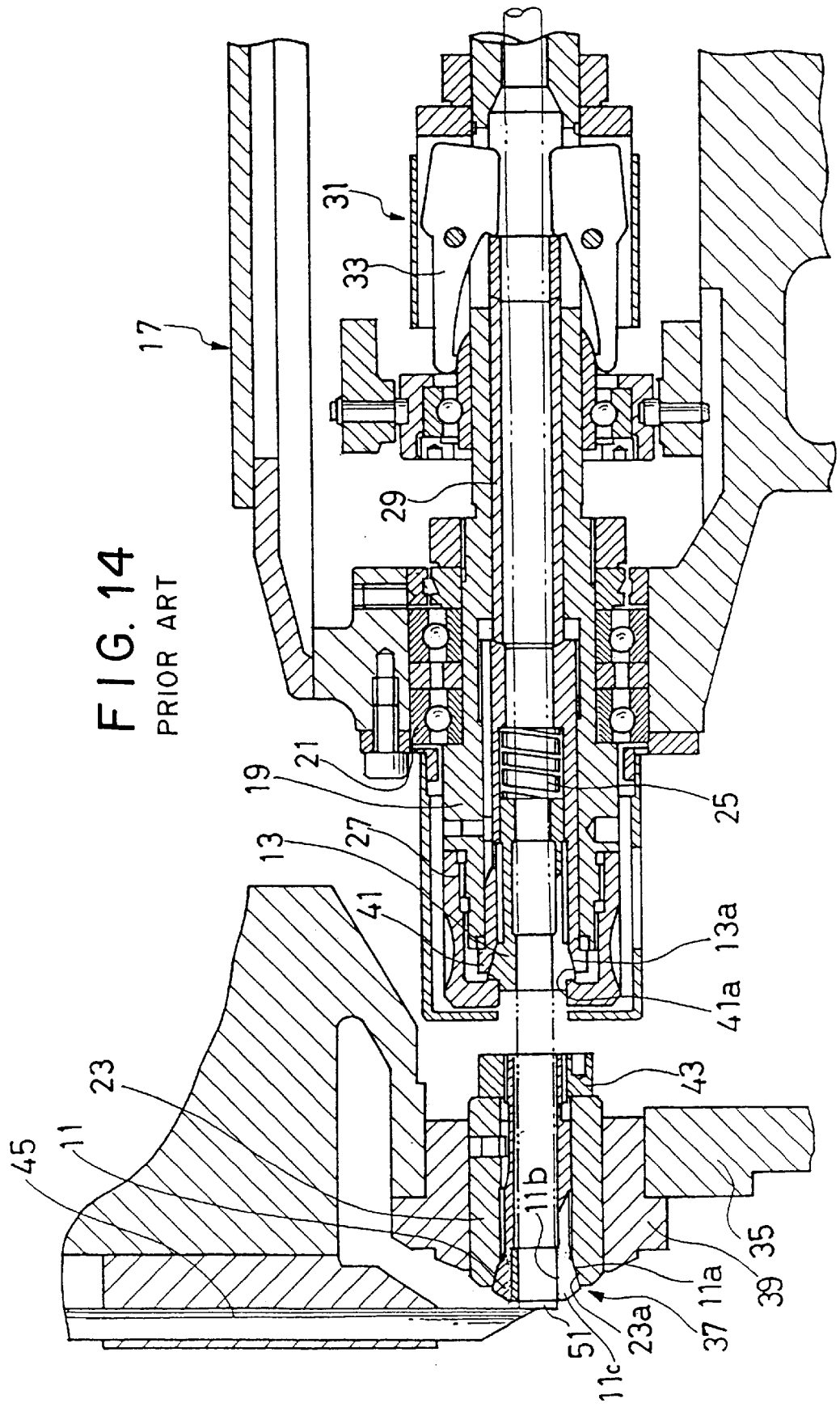
FIG. 14 is a sectional view showing only the vicinity of a spindle of an automatic lathe provided with a stationary guide bush unit.

FIGS. 14 and 15

The construction of an automatic lathe employing a guide bush for which the present invention is aiming will be briefly described first.

FIG. 14 shows only a spindle and associated parts of a numerically controlled automatic lathe in a sectional view. The automatic lathe is provided with a stationary guide bush unit 37 that holds a guide bush 11 fixedly to support a workpiece 51 (indicated by imaginary lines) rotatably on the inner surface 11b of the guide bush 11.

A spindle stock 17 is mounted on the bed, not shown, of the numerically controlled automatic lathe for sliding movement in transverse directions, as viewed in the drawing.

A spindle 19 is supported for rotation in bearings 21 on the spindle stock 17, and a collet chuck 13 is mounted on the nose of the spindle 19.

The collet chuck 13 is disposed in the center bore of a chucking sleeve 41. A taper outer surface 13a of the head thereof is in surface contact with a taper inner surface 41a of the chucking sleeve 41.

A coil spring 25 formed by winding a spring band is inserted in an intermediate sleeve 29 at the back end of the collet chuck 13. The collet chuck 13 can be pushed out of the intermediate sleeve 29 by the action of the coil spring 25.

The position of the front end of the collet chuck 13 is determined by a cap nut 27 fastened to the front end of the spindle 19 with screws and in contact with the front end of the collet chuck 13. The cap nut 27 restrains the collet chuck 13 from being pushed out of the intermediate sleeve 29 by the force of the coil spring 25.

A chuck operating mechanism 31 provided with chuck operating levers 33 is provided on the back end of the intermediate sleeve 29. The chuck operating levers 33 are operated to open or close the collet chuck 13 so that the collet chuck 13 releases or chucks the workpiece 51.

When the chuck operating levers 33 of chuck operating mechanism 31 are turned so that the front ends thereof are moved away from each other, operating portions of the chuck operating levers 33 in contact with the intermediate sleeve 29 move to the left, as viewed in FIG. 14 to push the intermediate sleeve 29 to the left. Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the taper inner surface 41a of the chucking sleeve 41 is pressed against the taper outer surface 13a of the slitted, coned head portion of the collet chuck 13 and the taper inner surface 41a of the chucking sleeve 41 moves to the left along the taper outer surface 13a of the collet chuck 13.

Consequently, collet chuck 13 is compressed and the inside diameter of the collet chuck 13 is reduced to grip the workpiece 51.

When releasing the workpiece 51 from the collet chuck 13 by expanding the collet chuck 13 so that the inside diameter of the collet chuck 13 is increased, the chuck operating levers 33 are turned so that the front ends thereof are moved toward each other to remove the force acting to the left on the chucking sleeve 41.

Then, the intermediate sleeve 29 and the chucking sleeve 41 are moved to the right as viewed in the drawing by the stored energy of the coil spring 25.

Consequently, the pressure applied to the taper outer surface 13a of the collet chuck 13 by the taper inner surface 41a of the chucking sleeve 41 is removed to allow the collet chuck 13 to expand by its own resilience, so that the inside diameter of the collet chuck 13 increases to release the workpiece 51.

Further, a column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A taper inner surface 23a is formed in the front portion of the bush sleeve 23.

The guide bush 11 having a front portion provided with a taper outer surface 11a and slits 11c are fitted in the center bore of the bush sleeve 23.

The clearance between the inner surface of the guide bush 11 and the outer surface of the workpiece 51 can be adjusted by turning an adjusting nut 43 screwed on the threaded portion of the guide bush 11 and contiguous with the back end of the guide bush unit 37.

That is, when the adjusting nut 43 is turned clockwise, the guide bush 11 moves to the right, as viewed in the drawing, relative to the bush sleeve 23 and the taper outer surface 11a of the guide bush 11, similarly to the taper outer surface of the collet chuck 13, is compressed by the taper inner surface 23a of the bush sleeve 23 and the inside diameter of the slitted front portion of the guide bush 11 is reduced.

A cutting tool (cutter) 45 is disposed further in front of the guide bush unit 37. The workpiece 51 is chucked by the collet chuck 13 mounted on the spindle 19 and supported by the guide bush unit 37. A portion of the workpiece 51 projecting from the guide bush unit 37 into a machining region is machined for predetermined machining by a combined motion of the cross feed motion of the cutting tool 45 and the longitudinal traverse motion of the spindle stock 17.

A rotary guide bush unit that rotatably supports a guide bush gripping a workpiece will be described next with reference to FIG. 15, in which parts like or corresponding to those shown in FIG. 14 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13. A guide bush unit 37 shown in the drawing holds the guide bush 11 so as to rotate in synchronism with the collet chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported in bearings 21 on the holder 39, and the guide bush 11 is fitted in the center bore of the bush sleeve 23.

The bush sleeve 23 and the guide bush 11 are similar in construction to those illustrated in FIG. 14, respectively. The clearance between the inner surface of the guide bush 11 and the outer surface of the workpiece 51 can be adjusted by turning an adjusting nut 43 screwed on the threaded portion of the guide bush 11 which is contiguous with the back end of the guide bush unit 37.

This automatic lathe shown in FIG. 15 is the same in construction as the automatic lathe illustrated in FIG. 14 except that this automatic lathe is provided with the rotary guide bush unit 37, and hence the further description thereof will be omitted.

Description of Guide Bush

Figure 12:
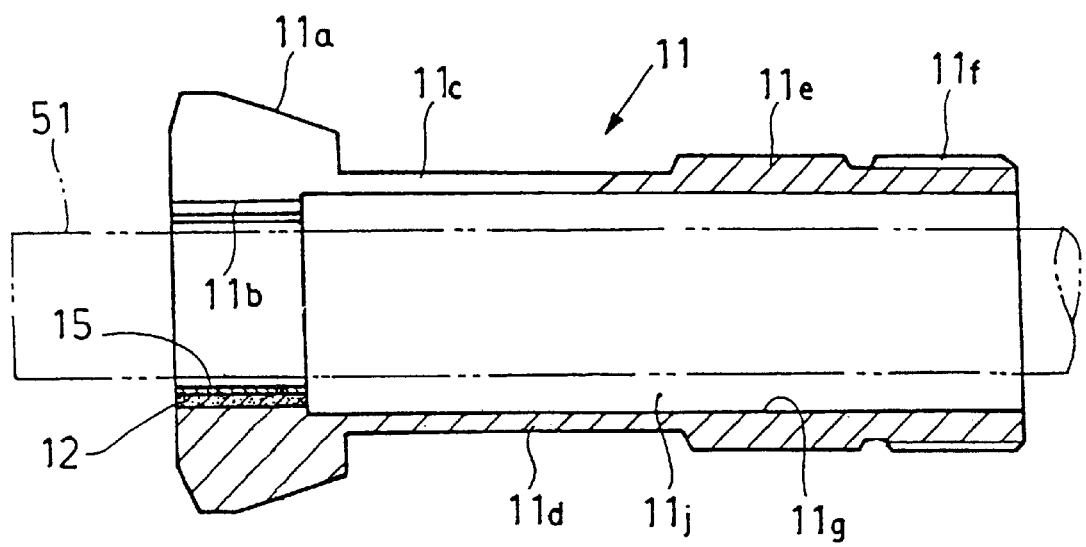
FIG. 12 is a longitudinal sectional view showing an example of a guide bush formed with a hard carbon film on the inner surface according to the present invention.
Figure 13:
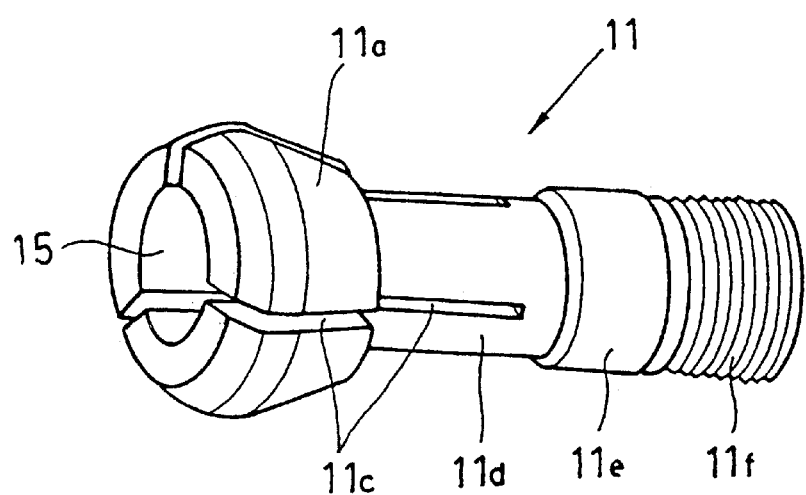
FIG. 13 is a perspective view thereof.

FIGS. 12 and 13

Guide bushes mounted on the automatic lathe and having an inner surface in sliding contact with a workpiece and formed with the hard carbon film according to the method of the present invention will be described next with reference to FIG. 12 and FIG. 13.

FIG. 12 is a longitudinal sectional view of the guide bush, and FIG. 13 is a perspective view showing its exterior.

Referring to the drawings, a guide bush 11 is shown in a free state in which a front end portion is open. The guide bush 11 is shaped substantially like a cylinder with a center bore 11j in the axial direction thereof and a head portion having a taper outer surface 11a at one longitudinal end thereof, and a threaded portion 11f in the other longitudinal end thereof.

Further, the center bore 11j of the guide bush forms an inner surface 11b that holds a workpiece 51, inside the head portion having the taper outer surface 11a, and forms a stepped section 11g having the internal diameter greater than that of the inner surface 11b, in the region of the center bore other than the inner surface 11b.

Three slits 11c are formed at angular intervals of 120° so as to extend through the head portion having the taper outer surface 11a and an elastic bendable portion 11d.

The clearance between the inner surface 11b and the workpiece 51 indicated by imaginary lines in FIG. 12 can be adjusted by pressing the taper outer surface 11a of the guide bush 11 by the taper inner surface of the bush sleeve, so that the elastic bendable portion 11d is bent.

Further, the guide bush 11 has a fitting portion 11e between the elastic bendable portion 11d and the threaded portion 11f. When the guide bush 11 is fitted in the center bore of the bush sleeve 23 shown in FIGS. 14 and 15, the fitting portion 11e fits the center bore closely to set the guide bush 11 with its axis in alignment with the center axis of the spindle.

The guide bush 11 is made of alloy tool steel (SKS). When forming the guide bush 11, a workpiece of carbon tool steel is machined in predetermined external and internal shapes, and the machined workpiece is subjected to quenching and annealing.

Preferably, a superhard lining 12 having a thickness of 2 mm to 5 mm is attached to the inner surface 11b of the guide bush 11 as shown in FIG. 12 by brazing.

The superhard lining is composed of, for example, 85% to 90% of tungsten (W), 5% to 7% of carbon (C), and 3% to 10% of cobalt (Co) as binder.

However, when the head portion having the taper outer surface 11a is compressed, a clearance in the range of 5 to 10 $\mu$m is formed between the inner surface 11b and the workpiece 51 in the radial direction thereof to allow the workpiece 51 to slide relative to the guide bush 11, which abrades the inner surface 11b.

Further, when the guide bush 11 is used on a stationary guide bush unit, the workpiece 51 supported on the guide bush 11 rotates at a high surface speed relative to the inner surface 11b and, when an excessively high pressure is applied to the inner surface 11b by the workpiece 51, seizing may occur.

Therefore, the inner surface 11b of the guide bush 11 is coated with a hard carbon film (DLC film) 15 of a thickness in the range of 1 to 5 $\mu$m.

The hard carbon film is very similar in properties to diamond as described above; the hard carbon has a high mechanical strength, a small coefficient of friction, a satisfactory self-lubricity, and excellent corrosion resistance.

Therefore, the hard carbon film 15 covering the inner surface 11b enhances the wear resistance of the guide bush remarkably, the guide bush 11 withstands an extended period of use and heavy machining, the wear of the inner surface 11b in contact with the workpiece 51 is reduced, the possibility of exerting abrasive damage to the workpiece 51 is reduced, and seizing between the guide bush 11 and the workpiece 51 can be avoided.

Although the hard carbon film can be formed directly over the inner surface of the base material (SKS) for the guide bush 11 or over the inner surface of the superhard lining 12, it may be formed by way of a thin intermediate layer (not illustrated) for enhancing adhesion to the inner surface 11b.

An element of group IVb in the periodic table of elements, such as silicon (Si) or germanium (Ge), a compound containing silicon or germanium, or a compound containing carbon, such as a silicon carbide (SiC) or titanium carbide (TiC) may be used as the intermediate layer. A compound of titanium (Ti), tungsten (W), molybdenum (Mo) or tantalum (Ta) and silicon (Si) may be applicable for the intermediate layer.

The intermediate layer may be a two-layer film consisting of a lower layer of titanium (Ti) or chromium (Cr), and an upper layer of silicon (Si) or germanium (Ge).

The titanium or chromium comprising the lower layer of the intermediate layer which works for enhancing adhesion to the base material of the guide bush 11 or the superhard lining 12, and silicon or germanium of the upper layer which works for forming covalent bond, which bonds the hard carbon film 15 firmly.

The thickness of the intermediate layer is to be approximately 0.5 μm. However, in the case where intermediate layer comprises two layers, the thickness of the upper and lower layers is to be respectively approximately 0.5 μm.

The intermediate layer may be formed by a sputtering process, an ion plating process, a chemical vapor deposition (CVD) process or a metal spraying process.

When the superhard lining 12 is made of silicon carbide (SiC), the intermediate layer may be omitted, because silicon carbide is a compound of silicon and carbon included in group IVb of the periodic table of elements and silicon carbide and the hard carbon film 15 formed on the superhard lining 12 make covalent bond which secure high adhesion.

The hard carbon film is formed directly over the inner surface 11b of the guide bush 11 or by way of the intermediate layer by employing the jig for forming the film in a vacuum vessel in the CVD method, details of which will be described later.

Jig for Forming Film
According to Present Invention

Figure 1:
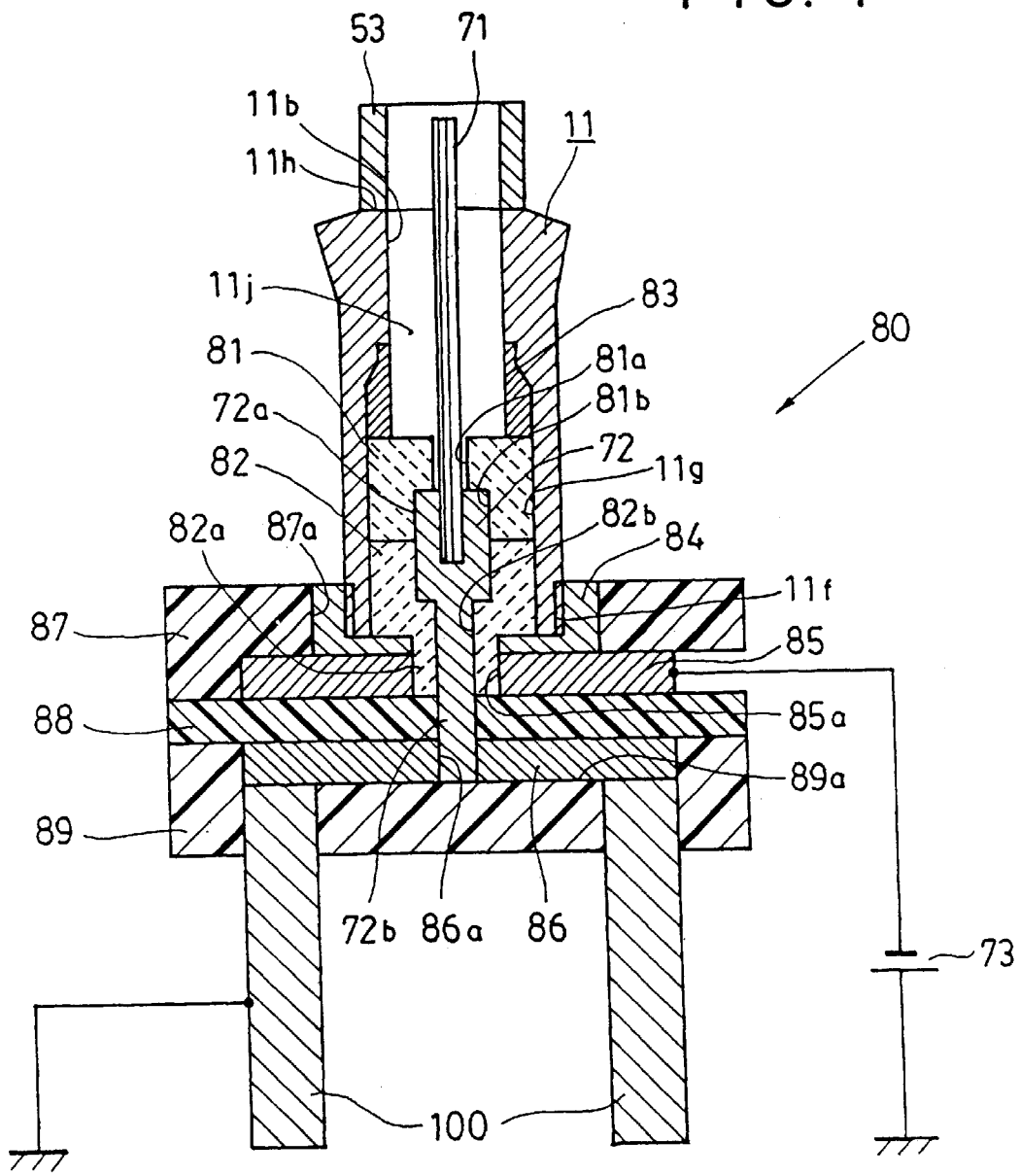
FIG. 1 is a sectional view showing a state of employing a jig in its best embodiment according to the present invention.
Figure 2:
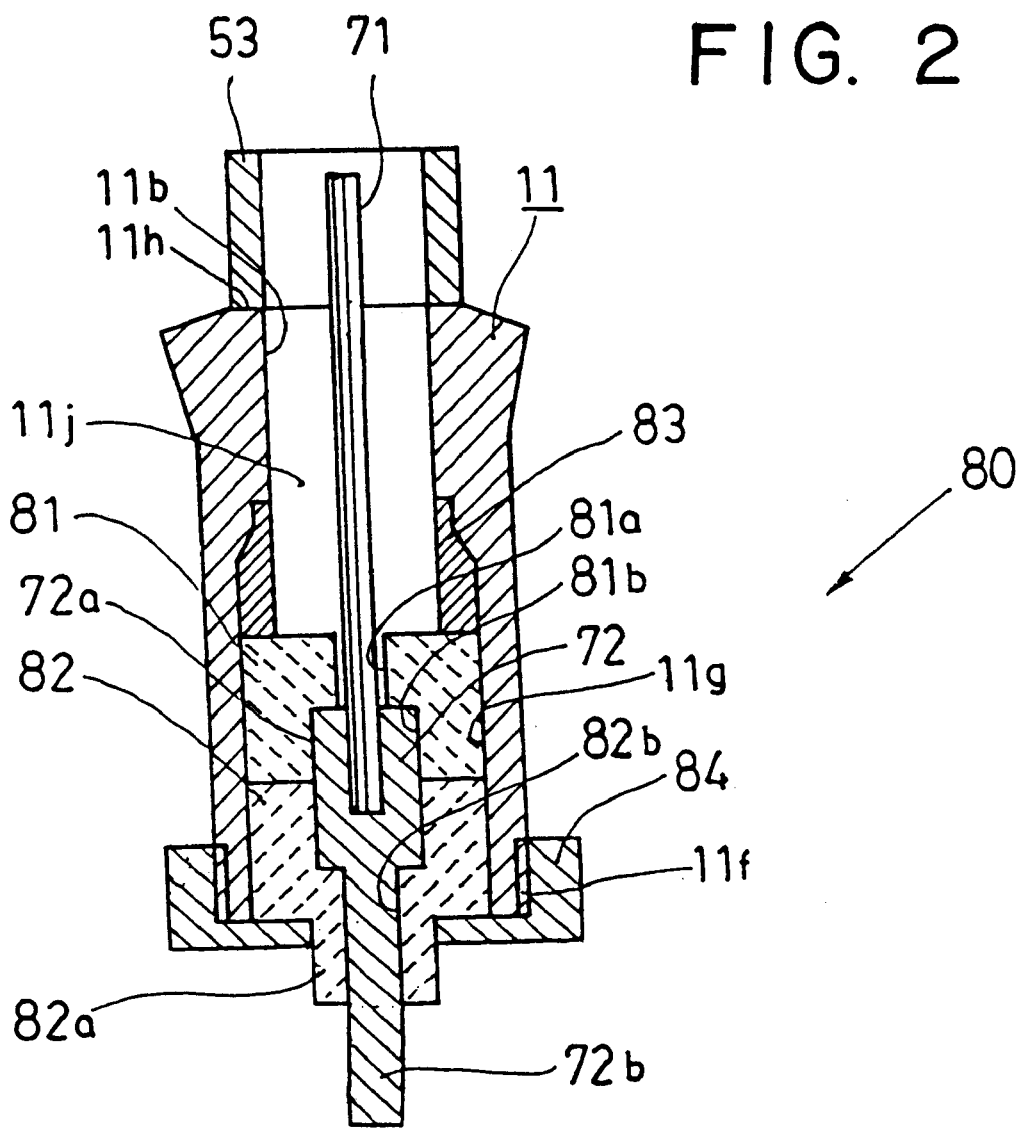
FIG. 2 is a sectional view showing only members mounted on the guide bush.

FIGS. 1 and 2

A best embodiment of a jig for forming the film according to the present invention will be described next with reference to FIG. 1 and FIG. 2. FIG. 1 is a sectional view showing a state in which a jig for forming a film is employed in its best embodiment according to the present invention, and FIG. 2 is a sectional view showing only members mounted on the guide bush.

The guide bush 11 shown in FIG. 1 and FIG. 2 shows an example thereof in which the inner surface 11b is formed without the superhard lining 12 shown in FIG. 1. However, this can be applied to a guide bush formed with the inner surface 11b with the superhard lining provided.

The jig 80 for forming the film comprises a member mounted on the guide bush 11 and a member secured fixedly on the bottom of the vacuum vessel.

The members mounted on the guide bush 11 comprise a rodlike auxiliary electrode 71, an auxiliary electrode support member 72, first and second porcelain insulators 81, 82, i.e., auxiliary electrode insulation members, an insertion member 83, a guide bush receptor 84, and a dummy member 53.

The auxiliary electrode 71 is fit into a large diameter portion 72a of the auxiliary electrode support member 72 to be supported there, and is inserted into a center bore 11j forming the inner surface 11b of the guide bush 11. The auxiliary electrode 71 is made of a metal such as stainless steel and is formed in a rodlike shape.

The first porcelain insulator 81 and the second porcelain insulator 82 as the auxiliary electrode insulation members are divided in the axial direction of the center bore 11j of the guide bush 11, and the both are fitted in the stepped section 11g. The first porcelain insulator 81 and the second porcelain insulator 82 are respectively made of ceramic insulation material.

The first porcelain insulator 81 and the second porcelain insulator 82 are provided with a throughhole for insertion of the auxiliary electrode 71 and the auxiliary electrode support member 72 for supporting the auxiliary electrode 71 by fitting therein, and further the second porcelain insulator 82 is provided with a projection 82a projecting out of the guide bush 11. The auxiliary electrode 71 is supported by the auxiliary electrode support member 72 so as to be disposed in the center of the center bore 11j of the guide bush 11.

The first porcelain insulator 81 is provided with a small diameter bore portion 81a through which the auxiliary electrode 71 is inserted with a clearance of 0.01 mm to 0.05 mm thereabout and a large diameter bore portion 81b for positioning the large diameter portion 72a of the auxiliary electrode support member 72. That is, the first porcelain insulator 81 is provided with a stepped bore portion.

Meanwhile, the second porcelain insulator 82 is provided with a stepped bore portion 82b for positioning the large diameter portion 72a and a small diameter portion 72b of the auxiliary electrode support member 72.

The large diameter portion 72a of the auxiliary electrode support member 72 is clamped between the two porcelain insulators 81 and 82 so that the small diameter portion 72b of the auxiliary electrode support member 72 is projected out of the second porcelain insulator 82.

The insertion member 83 comprises a conductive material having a cylindrical shape with a diameter equal to that of the inner surface 11b of the center bore 11j of the guide bush 11, the external shape of which fits the internal shape near the inner surface 11b of the center bore 11j of the guide bush 11. The insertion member 83 is inserted in the vicinity of the inner surface 11b of the stepped section 11g of the center bore 11j of the guide bush 11 and is held by the first porcelain insulator 81 at the lower end thereof.

Further, a guide bush receptor 84 provided with an internal thread is screwed on an external thread of the threaded portion 11f provided at the end portion of the stepped section side 11g of the guide bush 11. The guide bush receptor 84 is made of a metal such as stainless steel and serves to provide a large contact area to the guide bush 11 and a first electrode plate 85, described later, and to prevent the first porcelain insulator 81 and the second porcelain insulator 82 from being dropped off the center bore 11j of the guide bush 11.

The dummy member 53 comprises a conductive material having a cylindrical shape with a diameter substantially equal to that of the inner surface 11b of the center bore 11j of the guide bush 11 and is placed on an end face 11h of the bore of the guide bush, where it is fixed thereon easily detachable with an adhesive.

FIG. 2 shows a state in which the insertion member 83, the guide bush receptor 84, and the dummy member 53 are mounted on the guide bush 11 although they are not essential.

On the other hand, the members placed fixedly on the bottom of the vacuum vessel are the first electrode plate 85 to be connected electrically to the guide bush 11, the legs 100 placed on the bottom of the vacuum vessel, a second electrode plate 86 to be connected electrically to the auxiliary electrode support member 72, and the insulation member for insulating the first electrode plate 85 and the second electrode plate 86 and for fixing them to the legs 100. The first electrode plate 85, the second electrode plate 86, and the legs 100 are respectively made of a conductive material such as stainless steel.

The insulation member comprises a first insulation member 87 for covering the exposed portion of the first electrode plate 85, a second insulation member 89 for covering the exposed portion of the second electrode plate 86, and a third insulation member 88 interposed between the first electrode plate 85 and the second electrode plate 86. These may of an insulation material, i.e., ceramics such as aluminum or zirconia or a fluorocarbon resin such as Teflon (a registered trademark).

The first insulation member 87 is provided with an opening 87a which fits the external dimension of the guide bush receptor 84. The first electrode plate 85 is formed with a hole 85a for insertion of the projection 82a of the second porcelain insulator 82, while the second electrode plate 86 is provided with a center hole 86a for insertion of the small diameter portion 72b of the auxiliary electrode support member 72 projected out of the projection 82a.

The third insulation member 88 is also provided with a hole for piercing through the small diameter portion 72b of the auxiliary electrode support member 72. The second insulation member 89 for placing the third insulation member 88 thereon is provided with a recess 89a, in which the second electrode plate 86 is fitted so as to hold the surfaces tightly.

When the jig 80 for forming a film is used, the insertion member 83 and the first porcelain insulator 81 and the second porcelain insulator 82 for supporting the auxiliary electrode and the auxiliary electrode support member 72 are inserted into the center bore 11j of the guide bush 11 as shown in FIG. 2, and thereafter the guide bush receptor 84 is screwed on the threaded portion 11f to be fixed there, and the dummy member is placed and fixed on the end face 11h of inner surface 11b of the guide bush 11.

The guide bush receptor 84 is fit in the opening 87a of the first insulation member 87 by holding the guide bush 11, and the guide bush 11 is placed on the first electrode plate 85 with its axis perpendicular in a manner such that the bottom of the guide bush receptor 84 contacts the upper surface of the first electrode plate 85 as shown in FIG. 1.

At this time, since the guide bush receptor 84 is provided, the area where the guide bush 11 contacts the first electrode plate 85 becomes large. Accordingly, by connecting the power source 73 to the first electrode plate 85, a negative DC voltage can be applied to the guide bush 11 stably.

Also, at this time, the projection 82a of the second porcelain insulator 82 is fitted into the hole 85a of the first electrode plate 85. The small diameter portion 72b of the auxiliary electrode support member 72 projects downward out of the second porcelain insulator 82 and pierces through the third insulation member 88 to be fitted in the center hole 86a of the second electrode plate 86.

Therefore, the auxiliary electrode 71 is grounded through the auxiliary electrode support member 72, the second electrode plate 86, the legs 100 and a vacuum vessel, not illustrated.

By holding the auxiliary electrode support member 72 for supporting the auxiliary electrode 71 in the stepped section 11g of the guide bush 11 by way of the first porcelain insulator 81 and the second porcelain insulator 82, the auxiliary electrode 71 can be disposed accurately in the center of the center bore 11j of the guide bush 11.

In case the auxiliary electrode 71 is deviated from the axis of the center bore 11j of the guide bush 11, the plasma discharge between the auxiliary electrode 71 and the inner surface 11b of the guide bush 11 is unbalanced causing dispersion of the thickness and quality of the hard carbon film.

Therefore, by setting the external shape of the first porcelain insulator 81 and the second porcelain insulator 82 so as to fit the internal dimension of the stepped section 11g of the guide bush 11, and further by controlling the position of the auxiliary electrode 71 by the bore portions 81a, 81b and 82b of the porcelain insulators 81 and 82, the auxiliary electrode 71 can be accurately disposed in the center of the center bore 11j of the guide bush 11. Consequently, no dispersion of thickness and quality of the hard carbon film formed on the inner surface 11b is caused.

Further, since the projection 82a of the second porcelain insulator 82 projecting out of the guide bush 11 fits in the hole 85a of the first electrode plate 85 as described before, the guide bush 11 and the auxiliary electrode 71 can be separated and insulated perfectly from each other by the projection 82a.

When the dummy member 53 is used, the tip of the auxiliary electrode 71 should be within the upper end face of the dummy member 53 in a range of 1 mm to 2 mm as shown in the figure, and when it is not used, it should be within the upper end face 11h of the guide bush 11 in a range of 1 mm to 2 mm.

When the jig 80 for forming a film is used, an abnormal discharge such as an arc discharge is not caused at the first electrode plate 85 even when the time for processing the film is lengthened in order to form a thick carbon film since the exposed surface of the first electrode plate 85 is covered with the first insulation member 87.

In this embodiment, since the guide bush receptor 84 is provided and the guide bush 11 is placed on the first electrode plate 85 so that the bottom surface thereof contacts the upper surface of the first electrode plate 85, the guide bush 11 can be stabilized and have an increased area for conducting electricity, but the guide bush receptor 84 can be omitted and the guide bush 11 may be directly placed on the first electrode plate 85.

Next, embodiments for the method of forming a hard carbon film on the inner surface 11b of the guide bush 11 by employing the jig 80 for forming a film or the jig 80' for forming a film for a plurality of guide bushes will be described with reference to FIG. 3 to FIG. 11.

First Preferred Embodiment

FIG. 3

Figure 3:
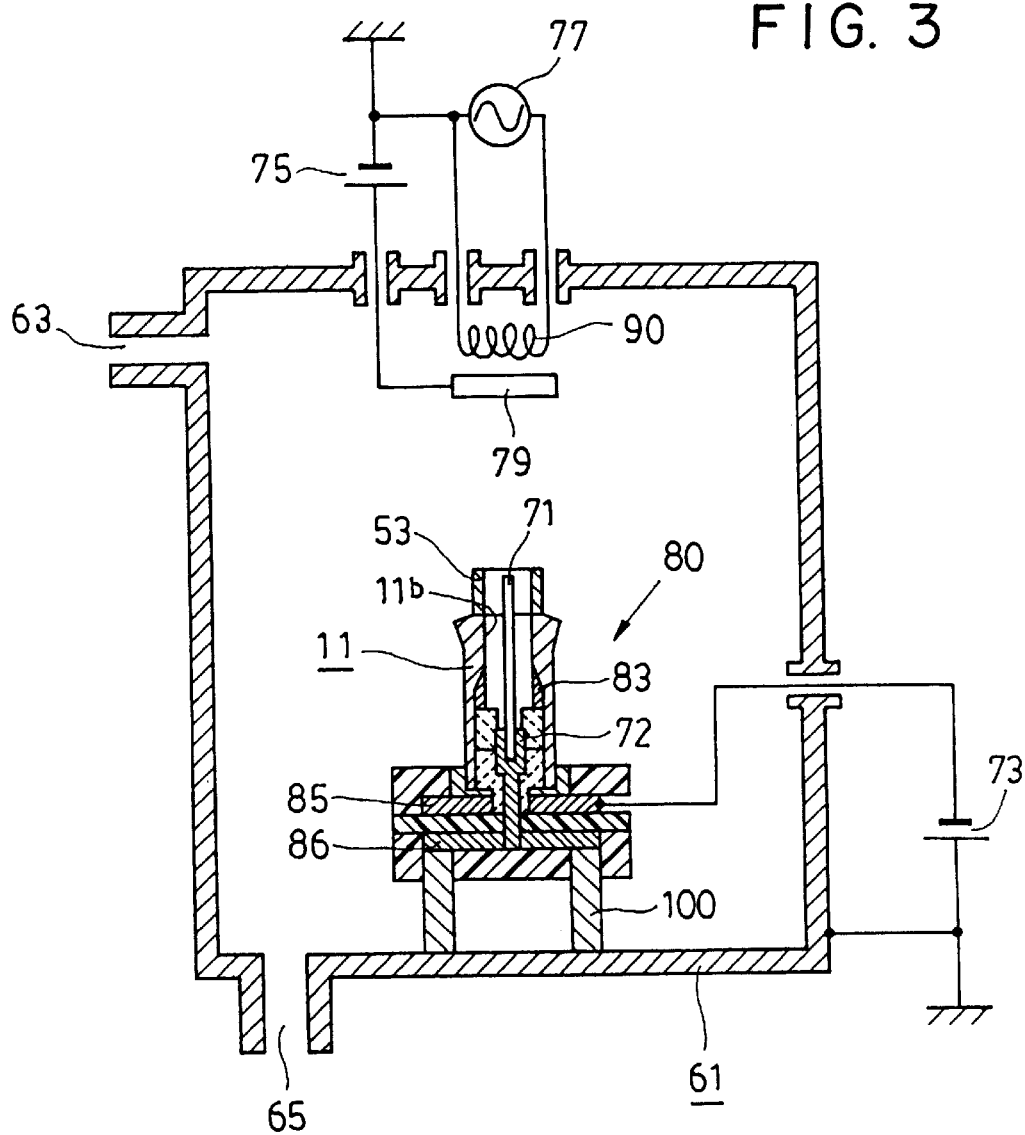
FIG. 3 is a sectional view illustrating the first embodiment in the method of forming the hard carbon film over the inner surface of a guide bush according to the present invention.

FIG. 3 is a sectional view of an apparatus employed in the method of forming a hard carbon film over the inner surface of a guide bush in the first embodiment according to the present invention.

In the first embodiment, the guide bush 11 is disposed in the vacuum vessel 61 provided with a gas inlet port 63 and an evacuation port 65 by using the jig 80 for forming the film described before as shown in FIG. 3. The description thereof will be omitted since the guide bush 11 relates to each member of the jig 80 for forming the film as shown in detail in FIG. 1.

The vacuum vessel 61 is grounded, and the first electrode 85 is connected to the negative side of a DC power source 73. The vacuum vessel 61 is provided with an anode 79 and a filament 90 at its upper inner portion thereof and the anode 79 is connected to an anode power source 75 while the filament 90 is connected to a filament power source 77.

The vacuum vessel 61 is evacuated to a vacuum of less than $3 \times 10^{-5}$ torr through the evacuation port 65 by an evacuation means, not illustrated.

Thereafter, benzene ($C_6H_6$) as a gas containing carbon is supplied through the gas inlet port 63 into the vacuum vessel 61 so that the pressure in the vacuum vessel 61 is adjusted to a vacuum of $5\times10^{-3}$ torr.

Subsequently, a DC voltage of −3 kV is applied to the guide bush 11 by the DC power source 73 through the first electrode plate 85, further a DC voltage of +50V is applied to the anode 79 by the anode power source 75, and further an AC voltage of 10V is applied to the filament 90 by the filament power source 77 so that a current of 30A flows.

Then, a plasma is produced around the guide bush 11 in the vacuum vessel 61 so that a hard carbon film of hydrogenated amorphous carbon is formed over the surface of the guide bush including the inner surface by the plasma CVD process.

In this case, since the auxiliary electrode 71 is disposed in the center of the center bore of the guide bush 11, the same potentials do not face each other in the inner region of the center bore, so that hollow cathode discharge, i.e., an abnormal discharge, does not occur and the adhesion of the hard carbon film formed on the inner surface 11b of the guide bush 11 is improved. Further, the hard carbon film can be formed in a uniform thickness from the open end through the depth thereof since the potential characteristic are uniform with respect to the longitudinal direction of the center bore of the guide bush 11.

The dummy member 53 is employed in this embodiment and in the following respective embodiments, the effect of which will be described here.

In the method of forming a hard carbon film shown in the drawing, a plasma is produced both around the inner surface of the guide bush 11 and in a region surrounding the guide bush. When the dummy member 53 is not used, electric charges are liable to be concentrated on the end face of the guide bush 11 and the potential of a portion of the guide bush 11 around the end face tends to become higher than that of the inner surface of the guide bush 11, leading to the so-called edge effect. Here, the intensity of the plasma in the vicinity of the end face of the guide bush 11 is greater than that in other portions thereof and is unstable. Further, a portion of the guide bush 11 around the end face is subject to the influence of both the plasma produced in a region surrounding the guide bush 11 and that produced inside the guide bush 11.

When a hard carbon film is formed under such conditions, the adhesion and quality of the hard carbon film differ slightly between at a portion in a range of several mm away from the end face of the guide bush 11 and at other portions thereof. When the hard carbon film is formed by disposing the dummy member 53 on the end face of the guide bush 11, the portion where the adhesion and the quality of the film are different is not formed on the inner surface of the guide bush 11 but is formed on the inner surface of the dummy member 53. As a result, the portion where the adhesion and the quality of the film are different is not formed at all on the inner surface of the guide bush 11.

According to the present embodiment, the exposed region of the first electrode plate 85 is covered with the first insulation member 87. Therefore, arc discharge is not generated at the first electrode plate 85 even when the time for forming the film is lengthened, so that increments of the film thickness of the hard carbon film formed on the inner surface 11b of the guide bush 11 can be achieved since a plasma discharge for a long period of time is possible, and durability of guide bushes can be extended and reliability in a long term use can be enhanced. Further, reproducibility of the quality and thickness of the hard carbon film formed on the inner surface 11b of the guide bush 11 is improved.

Further, the insertion member 83 is inserted in the vicinity of the inner surface 11b of the guide bush 11 in this embodiment. The insertion member 83 has an internal diameter substantially equal to that of the inner surface 11b of the center bore 11j of the guide bush 11. Accordingly, no steps are formed in the vicinity of the inner surface 11b of the guide bush 11.

Namely, the clearance between the inner surface 11b of the guide bush 11 on which the hard carbon film is formed and the vicinity thereof and the auxiliary electrode 71 is uniform so that the plasma discharge is stable around the auxiliary electrode 71. Accordingly, the quality and thickness of the hard carbon film formed over the inner surface of the guide bush can be improved.

Second Preferred Embodiment

FIG. 4

Figure 4:
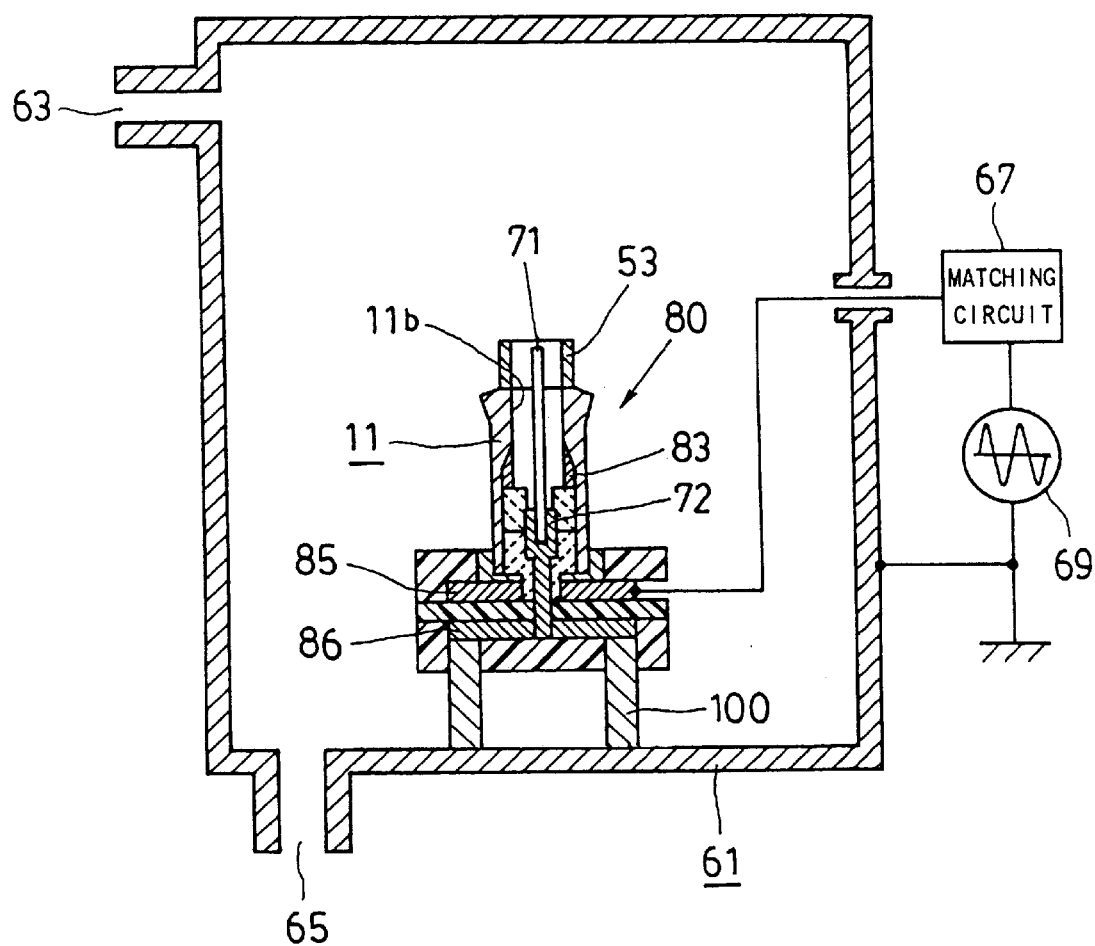
FIG. 4 is a sectional view for illustration of the second embodiment.

FIG. 4 is a sectional view of an apparatus employed in the second embodiment of the method of forming a hard carbon film over the inner surface of a guide bush.

In FIG. 4, parts like or corresponding to those shown in FIG. 3 are designated by the same reference characters and the description thereof will be omitted since the guide bush 11 relates to each member of the jig 80 for forming the film similarly as in FIG. 1.

The vacuum vessel 61 employed in the second embodiment is not provided with any anode 79 nor any filament 90 as shown in FIG. 1.

The guide bush 11 is disposed in the vacuum vessel 61 by using the jig 80 for forming the film similarly to the first embodiment described before.

The vacuum vessel 61 is evacuated to a vacuum of $3\times10^{-5}$ torr by an evacuation means, not illustrated, and thereafter methane gas ($CH_4$) as a gas containing carbon is supplied from the gas inlet port 63 into the vacuum vessel 61 so that the pressure in the vacuum vessel 61 is adjusted to a vacuum of 0.1 torr.

A plasma is produced in the vacuum vessel 61 by applying radio frequency power from a radio frequency power source 69 of 13.56 MHz in oscillation frequency through a matching circuit 67.

In the second preferred embodiment also, since the auxiliary electrode 71 is disposed in the center bore of the guide bush 11, a uniform plasma is produced around the outer surface and in the center bore of the guide bush so that a hard carbon film can be formed in a uniform thickness over the inner surface 11b. The operation and effect other than that are the same as in the first embodiment described before.

Third Preferred Embodiment

FIG. 5

Figure 5:
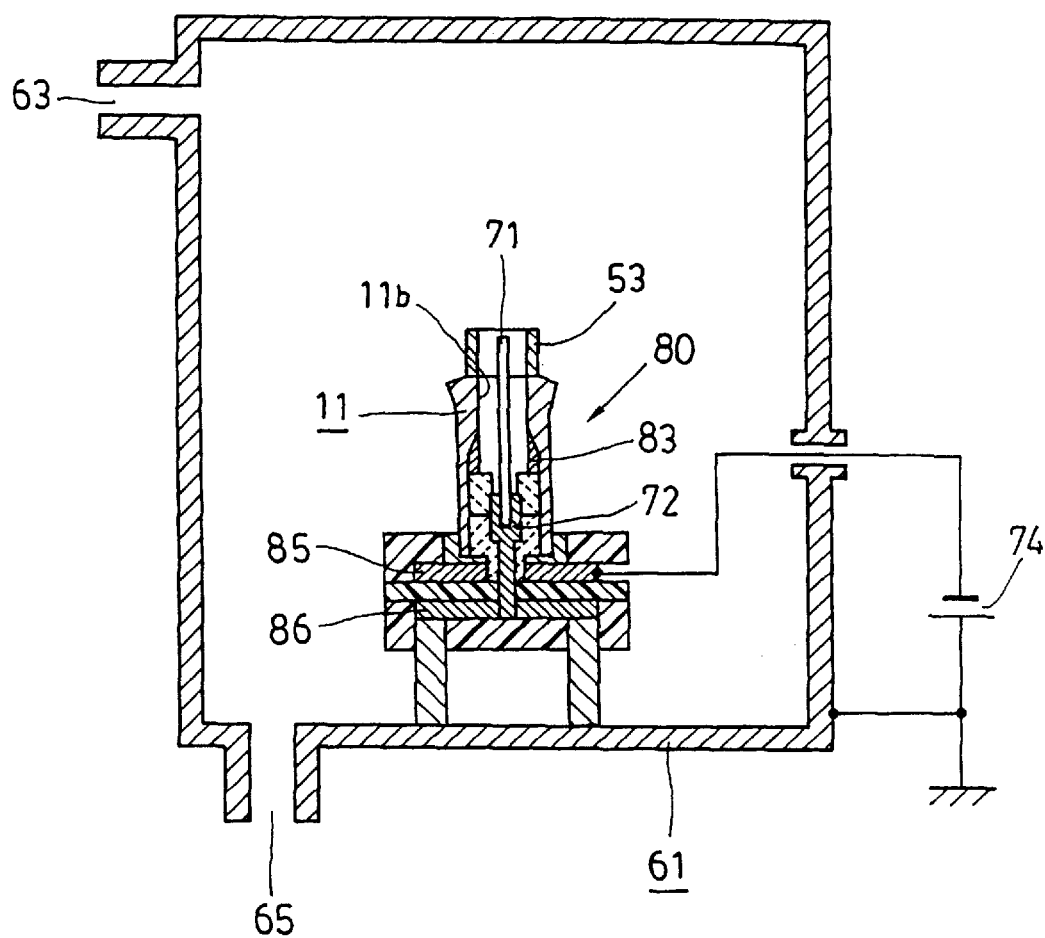
FIG. 5 is a sectional view for illustration of the third embodiment.

FIG. 5 is a sectional view of an apparatus for illustrating a method of forming a hard carbon film over the inner surface of a guide bush in the third embodiment according to the present invention.

In FIG. 5, parts like or corresponding to those shown in FIG. 3 are designated by the same reference characters and the description thereof will be omitted since the guide bush 11 relates to each member of the jig 80 for forming the film similarly as in FIG. 1.

The hard carbon film forming method in the third embodiment is different from the first embodiment shown in FIG. 3 in that the anode 79 and the filament 90 are not provided in the vacuum vessel 61, the vacuum vessel 61 is evacuated to a vacuum of less than $3\times10^{-5}$ torr and thereafter methane gas ($CH_4$) as a gas containing carbon is supplied from the gas inlet port 63 into the vacuum vessel 61 adjusting the vacuum to 0.1 torr, and a DC voltage of −600 V is applied from the DC power source 74 to the first electrode plate 85 to be connected to the guide bush 11 so that a plasma is produced in the vacuum vessel 61.

In the third preferred embodiment also, a hard carbon film can be formed in a uniform thickness over the inner surface 11b of the guide bush 11. The operation and effect other than that are the same as in the embodiments described before.

Fourth Preferred Embodiment

FIG. 6

Embodiments for forming a hard carbon film simultaneously over the inner surface of a guide bush employing a plurality of jigs 80 for forming the film will be described next with reference to FIG. 6 to FIG. 8.

Figure 6:
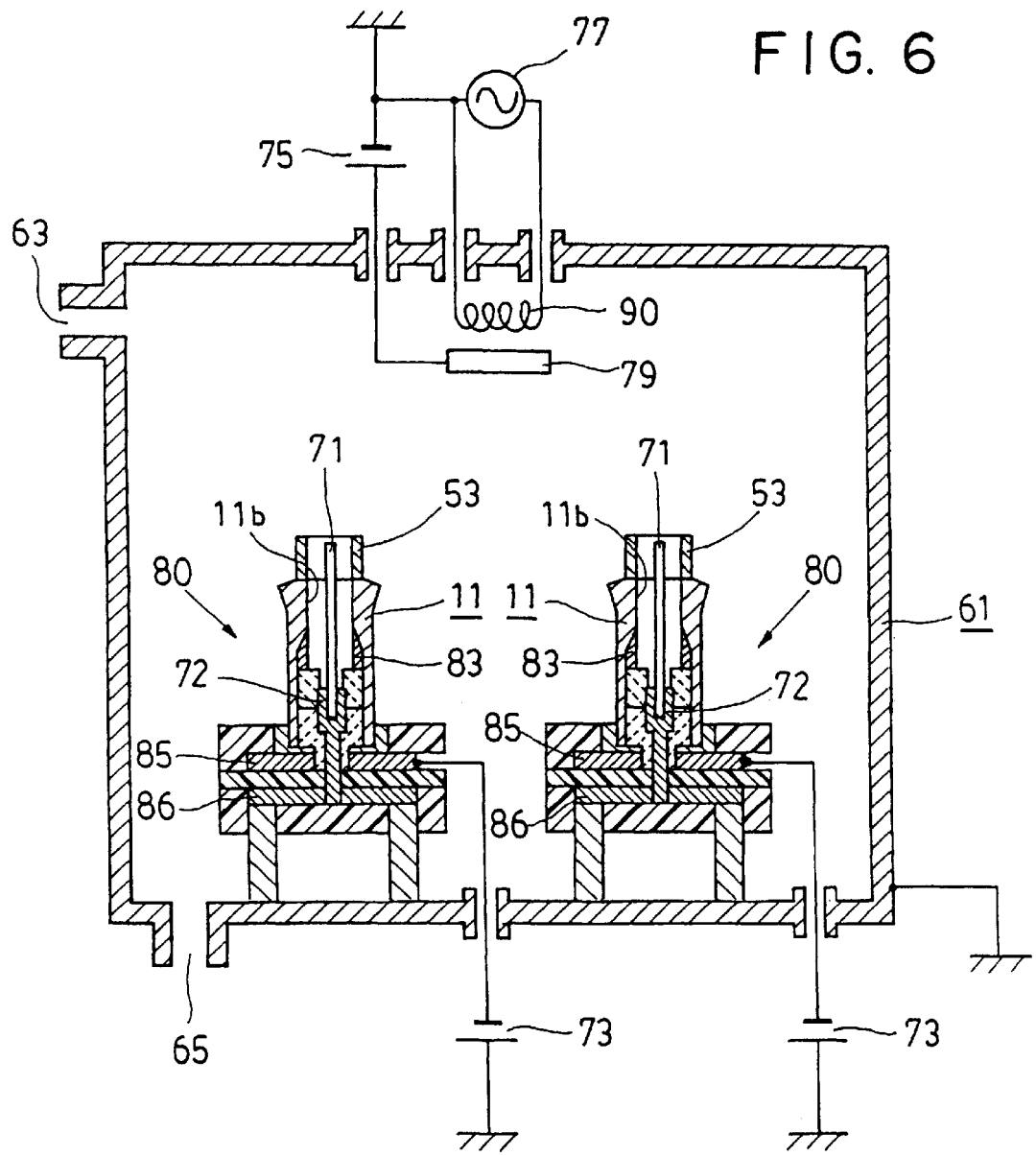
FIG. 6 is a sectional view for illustration of the fourth embodiment.

The fourth embodiment shown in FIG. 6 is carried out by the same plasma production method described in the first embodiment with reference FIG. 3. The method in the fourth embodiment is the same as the first embodiment shown in FIG. 3 except in that a plurality of (two in the drawing) guide bushes 11, 11 are provided with the jigs 80, 80 for forming the film in one vacuum vessel 61, and each of the first electrode plates 85, 85 of the jigs 80, 80 for forming the film is supplied with a DC voltage of −3 kV by respective independent DC power source 73.

Thus, the respective guide bushes 11, 11 are supplied with a negative DC voltage by independent DC power sources 73, 73, and independency of the plasma discharge can be enhanced, thereby preventing interference between the plasma discharges, and stabilizing the plasma discharge in the center bore of the respective guide bushes 11. Consequently the hard carbon film formed over the inner surfaces 11b of the respective guide bushes 11 is formed without dispersion of film thickness and the quality thereof can be improved.

According to the embodiment, the hard carbon film can be formed simultaneously over the respective inner surfaces 11b of a plurality of the guide bushes 11 uniformly with excellent quality. The operation and effect other than that are the same as in the first embodiment described before.

Although an example in which the hard carbon film is formed simultaneously over the inner surfaces 11b of two guide bushes 11 is shown here, the hard carbon film can be formed simultaneously over the inner surfaces 11b of three or more guide bushes 11.

Fifth Preferred Embodiment

FIG. 7

Figure 7:
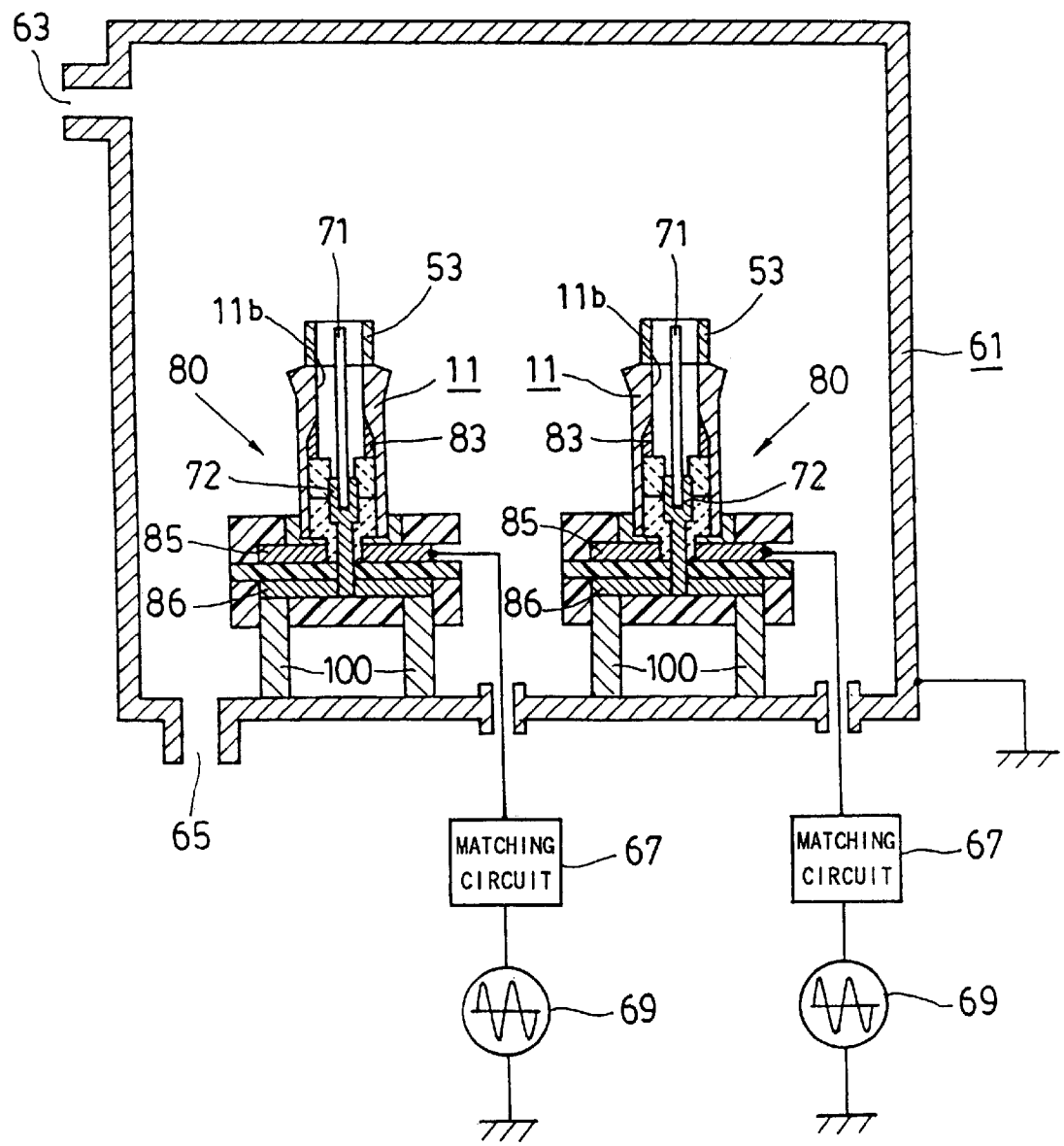
FIG. 7 is a sectional view for illustration of the fifth embodiment.

The fifth embodiment shown in FIG. 7 is carried out by the same plasma production method described in the second embodiment with reference to FIG. 4. This method in the fifth embodiment is the same as the second embodiment shown in FIG. 4 except in that a plurality of (two in the drawing) guide bushes 11, 11 are disposed in one vacuum vessel 61 by using the jigs 80, 80 for forming the film, and each of the first electrode plates 85, 85 of the jigs 80, 80 for forming the film is supplied with a radio frequency power of 13.56 MHz in oscillation frequency through a matching circuit 67, 67 by respective independent radio power source 69.

In this embodiment also, since the respective guide bushes 11, 11 are supplied with a radio frequency power by respective independent radio frequency power source 69, independency of the plasma discharge can be enhanced, thereby preventing interference between the plasma discharges, stabilizing the plasma discharge in the center bore of the respective guide bushes 11, and consequently an effect equal to the fourth embodiment described above can be obtained.

In this embodiment also, the hard carbon film can be formed simultaneously over the respective inner surfaces 11b of a plurality of guide bushes 11 uniformly with excellent quality. The operation and effect other than that are the same as in the second embodiment described before.

Sixth Preferred Embodiment

FIG. 8

Figure 8:
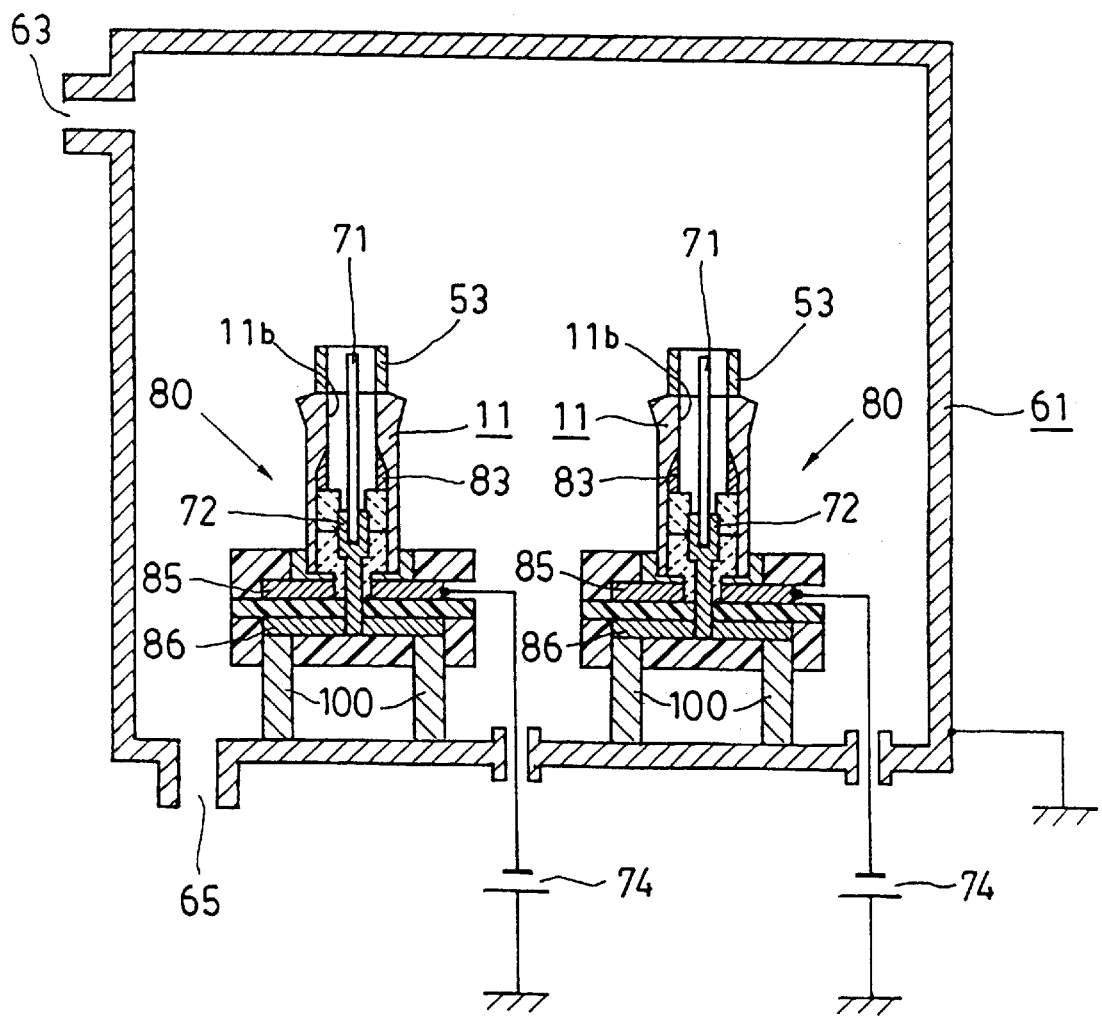
FIG. 8 is a sectional view for illustration of the sixth embodiment.

The sixth embodiment shown in FIG. 8 is carried out by the same plasma production method described in the third embodiment with reference to FIG. 5. The method in the sixth embodiment is the same as the third embodiment shown in FIG. 5 except in that a plurality of (two in the drawing) guide bushes 11, 11 are disposed in one vacuum vessel 61 by using the jigs 80, 80 for forming the film, and each of the first electrode plates 85, 85 of the jigs 80, 80 for forming the film supplied with a voltage of −600V by respective independent negative DC power source 74.

In this embodiment also, since the respective guide bushes 11, 11 are supplied with a positive DC voltage by respectively independent positive DC power sources 74, 74, independency of the plasma discharge can be enhanced, thereby preventing interference between the plasma discharges, and stabilizing the plasma discharge in the center bores of the guide bushes 11, and consequently an effect equal to the fourth embodiment described above can be obtained.

In this embodiment also, the hard carbon film can be formed simultaneously over the respective inner surfaces 11b of a plurality of guide bushes 11 uniformly with excellent quality. The operation and effect other than that are the same as in the third embodiment described before.

Jig for Forming Film for Plurality of Guide Bushes

FIGS. 9, 10, 11

Figure 9:
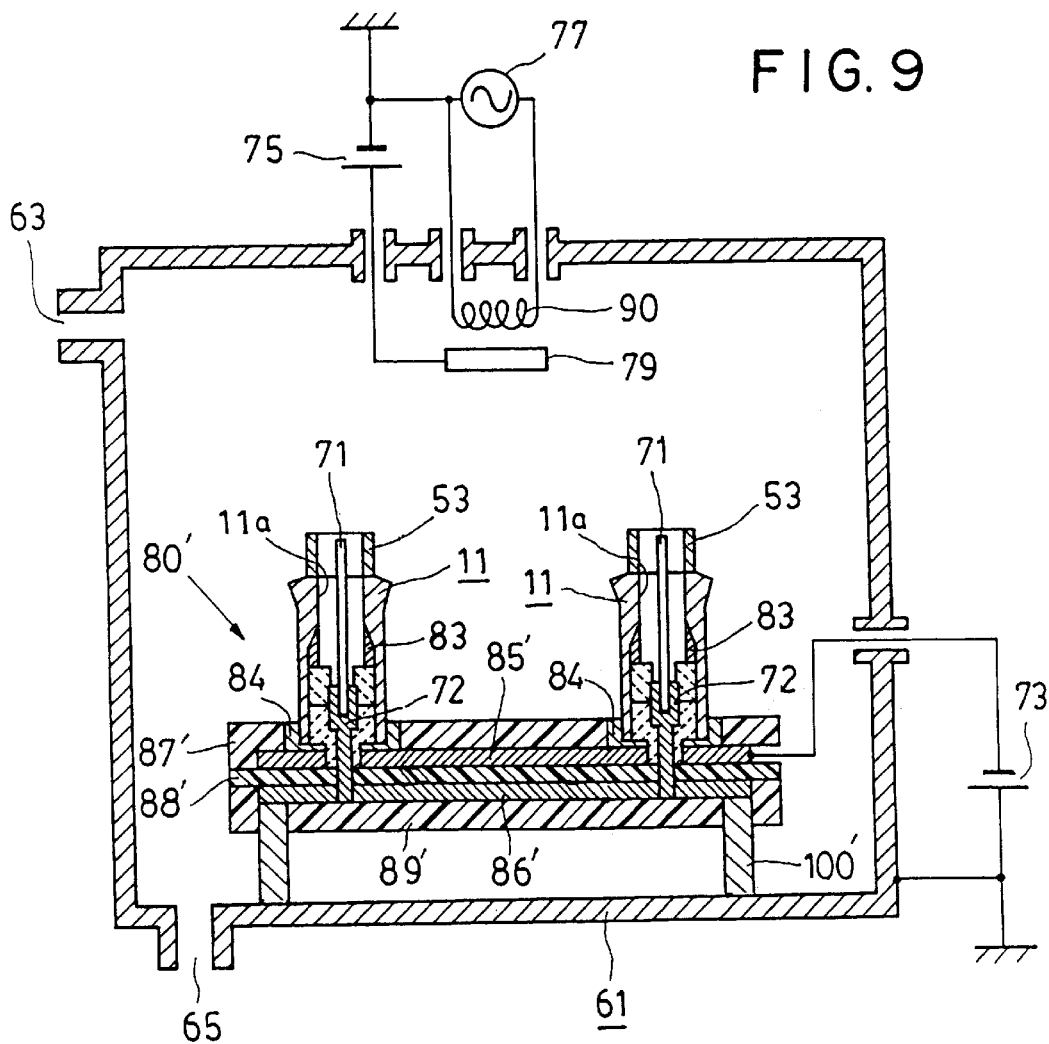
FIG. 9 is a sectional view for illustration of an apparatus according to the seventh embodiment of the present invention for forming the hard carbon film over the inner surface of a guide bush employing a jig for forming the film with a structure in another embodiment.
Figure 10:
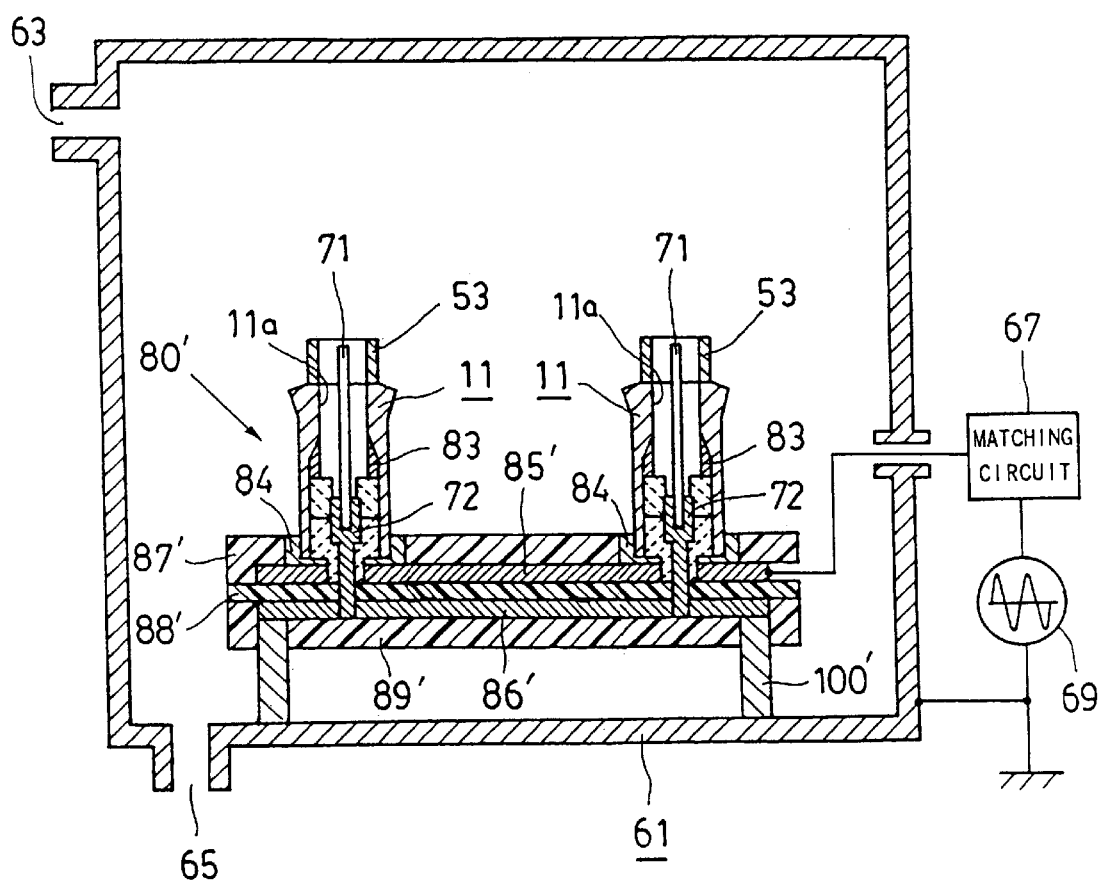
FIG. 10 is a sectional view for illustration of the eighth embodiment.
Figure 11:
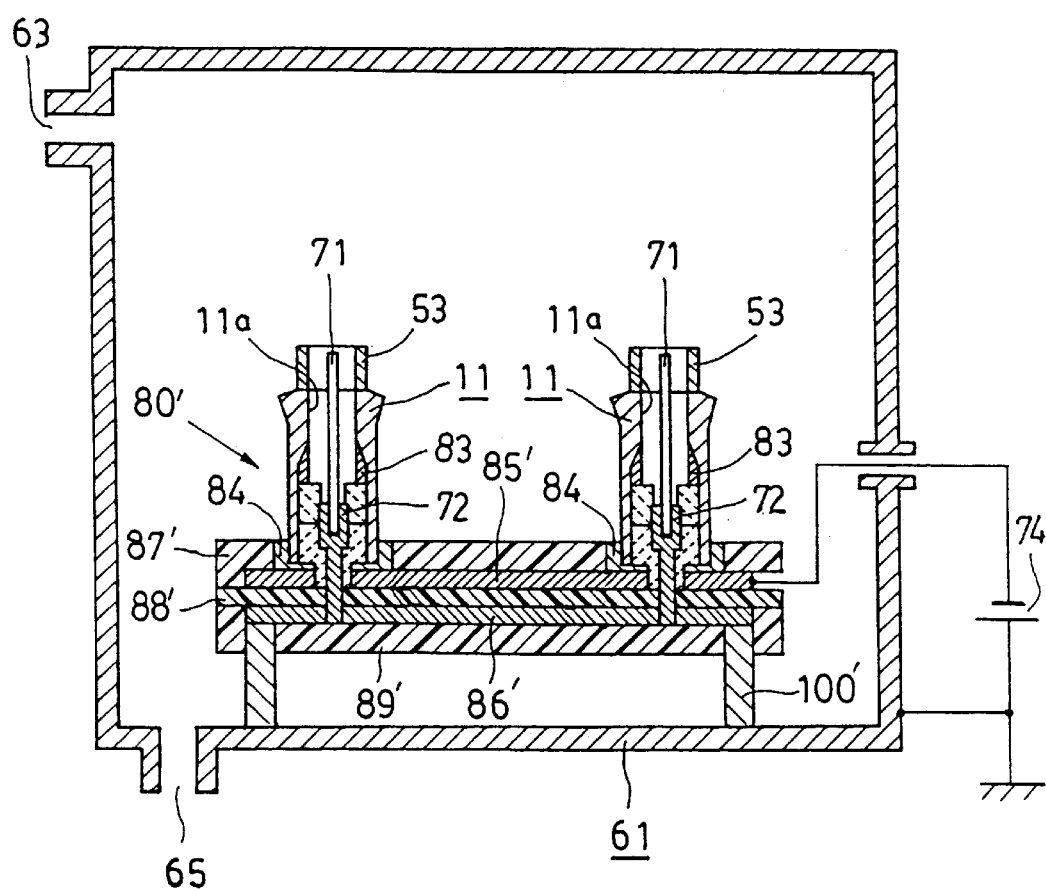
FIG. 11 is a sectional view for illustration of the ninth embodiment.

The jig 80' for forming a film employed for forming a carbon film simultaneously over a plurality of guide buses which is shown in FIGS. 9 to 11 is provided with a plurality of rodlike auxiliary electrodes 71, 71 to be inserted into the center bores forming the inner surfaces 11b of a plurality of the guide bushes 11, 11, a plurality of auxiliary electrodes support members 72, 72 for supporting the respective auxiliary electrodes 71, 71 and a plurality of porcelain insulators (auxiliary electrode insulation members) 81, 81, 82, 82 for fixing the respective auxiliary electrode support members 72, 72 inserted into the expanded section of the center bores of the respective guide bushes 11, 11. They are also provided with a plurality of guide bush receptors 84, 84, a plurality of insertion members 83, 83 to be inserted into the plurality of the guide bushes 11, 11, and a plurality of dummy members 53, 53 to be mounted on the end faces of the respective guide bushes 11, 11, all of which are the same as the respective members of the jig 80 for forming the film described before. Not only two of these members but also the number of them corresponding to the number of guide bushes 11 which can be disposed simultaneously are provided on the jig.

Further, the jig 80' is provided with a common first electrode plate 85' made of a conductive material to be contacted electrically on which a plurality of the guide bushes 11, 11 are mounted with their axes perpendicular, common legs 100 made of a conductive material to be put on the bottom of the vacuum vessel 61, a common second electrode plate 86' made of a conductive material for insertion of the small diameter portions of the auxiliary electrode support members 72, 72 which are integrated with the legs 100, and common insulation members 87', 88', 89' fixed to the legs 100' for insulation between the first electrode plate 85' and the second electrode plate 86'.

The first insulation member 87' is provided with a plurality of holes for the plurality of the guide bushes receptors 84, 84 to be fitted therein.

Seventh Preferred Embodiment
FIG. 9

An embodiment for forming a hard carbon film over the inner surface employing a plurality of jigs 80' for forming a film simultaneously over a plurality of guide bushes will be described next FIG. 9 is a sectional view of an apparatus for illustration of the seventh embodiment according to the present invention for forming the hard carbon film over the inner surface of a guide bush. In FIG. 9, parts like or corresponding to those shown in FIG. 6 are designated by the same reference characters and description thereof will be omitted.

The method in the seventh embodiment is the same as the fourth embodiment shown in FIG. 6 except in that a plurality of guide bushes 11, 11 are disposed in the vacuum vessel 61 by using the jig 80' for forming the film, and the respective guide bushes 11, 11 are supplied with a voltage of −3 kV through a common first electrode plate 85' by a common DC power source 73.

Accordingly, although the operation and effect are almost the same as those of the fourth embodiment, the hard carbon film can be formed simultaneously and uniformly over the respective inner surfaces of a multiplicity of guide bushes at a lower cost and with greater efficiency since the members secured in the vacuum vessel 61 are commonly used for the plurality of the guide bushes 11, and the DC power source 73 for applying a DC voltage of −3 kV to the respective guide bushes is also commonly used for the respective guide bushes 11.

Eighth Preferred Embodiment
FIG. 10

FIG. 10 is a sectional view of an apparatus for illustration of the eighth embodiment of the method of forming the hard carbon film over the inner surface of the guide bush according to the present invention. In FIG. 10, parts like or corresponding to those shown in FIG. 7 are designated by the same reference characters and description thereof will be omitted.

The method in the eighth embodiment is the same as the fifth embodiment shown in FIG. 7 except in that a plurality of guide bushes 11, 11 are disposed in the vacuum vessel 61 by using the jig 80' for forming the film, and the respective guide bushes 11, 11 are supplied with radio frequency power through a common matching circuit 67, and the first electrode plate 85' is supplied by a common radio frequency power source 69.

Accordingly, although the operation and effect other than that are the same as in the fifth embodiment described before, the members of the jig for forming the film which are secured in the vacuum vessel 61 are common to a plurality of the guide bushes 11, and the radio frequency power source 73 for applying radio frequency power to the respective guide bushes and the matching circuit 67 are also common to the respective guide bushes 11, so that the hard carbon film can be formed simultaneously over the respective inner surfaces of the guide bushes at a lower cost and with greater efficiency.

Method According to Ninth Embodiment
FIG. 11

FIG. 11 is a sectional view of an apparatus for illustration of the ninth embodiment for forming the hard carbon film over the inner surface of the guide bush according to the present invention. In FIG. 11, parts like or corresponding to those shown in FIG. 8 are designated by the same reference characters and description thereof will be omitted.

The ninth embodiment is the same as the sixth embodiment shown in FIG. 8 except in that a plurality of guide bushes 11, 11 are disposed in the vacuum vessel 61 by using the jigs 80' for forming the film, and the respective guide bushes 11, 11 are applied with a DC voltage of −600V through a common first electrode plate 85' by a common DC power source 74.

Accordingly, although the operation and effect other than that are almost the same as in the sixth embodiment described before, the members of the jig for forming the film which are secured in the vacuum vessel 61 are common to a plurality of the guide bushes 11 and the DC power source 74 for applying a DC voltage of −600V to the respective guide bushes 11 is also common to the respective guide bushes 11, so that the hard carbon film can be formed simultaneously over the respective inner surfaces of the guide bushes at a lower cost and more efficiently.

Supplementary Explanation

In the method of forming the hard carbon film according to the present invention described with reference to FIG. 3 to FIG. 11, although an example in which methane gas or benzene gas as a gas containing carbon is used, a gas containing carbon other than methane, such as ethylene or a vapor of a liquid containing carbon such as hexane may also be used.

Further, argon (Ar) gas, nitrogen ($N_2$) gas, helium (He) gas or hydrogen ($H_2$) gas may be added to the methane, ethylene or hexane gasses containing carbon.

Thus, addition of argon gas or nitrogen gas to the gas containing carbon controls the speed of forming the film. Thereby, the hard carbon film can be minute, and further, any part of the hard carbon film with poor adhesion and quality can be removed by sputtering using nitrogen or argon, thereby improving the quality of the film. Further, when hydrogen is added to the gas containing carbon, any dangling bonds of the carbon can be filled with the hydrogen, which is effective for improving the quality of the hard carbon film.

What is claimed is:

1. A jig for forming a film by supporting a guide bush in a vacuum vessel and conducting electricity through the guide bush when a hard carbon film is formed over an inner surface of the guide bush to be mounted on an automatic lathe and to be in sliding contact with a workpiece by a plasma CVD process, comprising:

a rodlike auxiliary electrode inserted into a center bore forming the inner surface of the guide bush, an auxiliary electrode support member made of a conductive material for supporting the auxiliary electrode along with the axis of the center bore so as to face the inner surface, an auxiliary electrode insulation member inserted into an stepped section which has a internal diameter larger than the internal diameter of the inner surface of the center bore of the guide bush so as to fix the auxiliary electrode support member in the guide bush and to project the same in the opposite direction of the auxiliary electrode along the center axis thereof, a first electrode plate made of a conductive material on which the guide bush is mounted with its axis perpendicular while the end portion of the stepped section side is contacted therewith electrically, legs made of a conductive material to be put on the bottom of the vacuum vessel, a second electrode plate made of a conductive material which is integrated with the legs and is connected with the projection of the auxiliary electrode support member projected out of the auxiliary electrode insulation member, and an insulation member for insulating the first electrode plate from the second electrode plate and for fixing them to the legs.

2. A jig for forming a film according to claim 1 having a guide bush receptor which comprises a conductive material mounted on the end portion of the stepped section side of the guide bush or on the first electrode plate to enlarge a contact area therebetween.

3. A jig for forming a film according to claim 1 having an insertion member made of a cylindrical conductive material having an internal diameter equal to that of the inner surface of the center bore of the guide bush that is to be inserted between the inner surface of the stepped section of the center bore and the auxiliary electrode insulation member.

4. A jig for forming a film according to claim 1, wherein the auxiliary electrode insulation member comprises two porcelain insulators divided in the axial direction of the center bore of the guide bush, the auxiliary electrode support member being supported by the two porcelain insulators, and the auxiliary electrode supported by the auxiliary electrode support member being projected out of one of the porcelain insulators while a portion of the auxiliary electrode support member is projected out of the other porcelain insulator.

5. A jig for forming a film according to claim 1 wherein the insulation member for insulating the first electrode plate from the second electrode plate and for fixing them to the legs comprises:

an insulation plate interposed between the first electrode plate and the second electrode plate and insulation members for covering the exposed portions of the first electrode plate and the second electrode plate respectively.

6. A jig for forming a film according to claim 1 having a dummy member comprising a conductive material and having a cylindrical shape with an internal diameter substantially equal to that of the inner surface of the center bore of the guide bush and mounted on the end face of the guide bush boring at the inner surface.

7. A jig for forming a film comprising:

a plurality of rodlike auxiliary electrodes respectively inserted into each of center bores which forms the inner surfaces of a plurality of guide bushes, a plurality of auxiliary electrode support members made of a conductive material for respectively supporting each of the auxiliary electrodes so as to face the inner surface along with the axis of the center bore of each of the plurality of the guide bushes, a plurality of auxiliary electrode insulation members inserted into each of stepped sections which have an internal diameter larger than the internal diameter of the inner surfaces of the bores of the guide bushes so as to fix each of the auxiliary electrode support members in the guide bushes and to project the same in the opposite direction of the auxiliary electrodes along the axes thereof, a common first electrode plate made of a conductive material on which the plurality of guide bushes are mounted with their axes perpendicular while the end portions of the stepped section sides are contacted therewith electrically, common legs made of a conductive material to be put on the bottom of the vacuum vessel, a second electrode plate made of a conductive material which is integrated with the legs and to be connected with the projection of the auxiliary electrode support members projected out of the auxiliary electrode insulation members, and an insulation member for insulating the first electrode plate from the second electrode plate and for fixing them to the legs.

8. A jig for forming a film according to claim 7 having a plurality of guide bush receptors which comprise a conductive material mounted on each of the end portions of the stepped section sides of a plurality of guide bushes or on the first electrode plate to enlarge a contact surface therebetween.

9. A jig for forming a film according to claim 7 having a plurality of insertion members respectively made of a cylindrical conductive material having an internal diameter equal to that of the inner surfaces of the center bores of the guide bushes and to be inserted between the inner surfaces of the expanded section of the center bores and the auxiliary electrode insulation members.

10. A jig for forming a film according to claim 7, wherein the auxiliary electrode insulation members comprise two porcelain insulators divided in the axial direction of the center bore of the guide bush, the auxiliary electrode support members are supported by the two porcelain insulators, and the auxiliary electrodes supported by the auxiliary electrode support members are projected out of one of the porcelain insulators while a portion of the auxiliary electrode support members are projected out of the other porcelain insulator.

11. A jig for forming a film according to claim 7 wherein the insulation members for insulating the first electrode plate from the second electrode plate and for fixing them to the legs comprise an insulation plate interposed between the first electrode plate and the second electrode plate and insulation members for covering the exposed portions of the first electrode plate and the second electrode plate respectively.

12. A jig for forming a film according to claim 7 having a plurality of dummy members each comprising a conductive material and having a cylindrical shape with an internal diameter substantially equal to that of the inner surface of the center bore of the guide bushes and respectively mounted on the end face of each of the guide bushes where the inner surface of the center bore is opened.

* * * * *